(12) United States Patent
Kondo et al.

(10) Patent No.: US 8,634,237 B2
(45) Date of Patent: Jan. 21, 2014

(54) MAGNETIC MEMORY DEVICE

(75) Inventors: Tsuyoshi Kondo, Kanagawa-ken (JP);
Hirofumi Morise, Kanagawa-ken (JP);
Shiho Nakamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 13/422,030

(22) Filed: Mar. 16, 2012

(65) Prior Publication Data
US 2013/0077395 A1  Mar. 28, 2013

(30) Foreign Application Priority Data
Sep. 26, 2011  (JP) ................ P2011-209990

(51) Int. Cl.
*G11C 11/14*   (2006.01)

(52) U.S. Cl.
USPC ............ 365/171; 365/173; 365/158; 365/209

(58) Field of Classification Search
USPC ................... 365/171, 173, 158, 209
See application file for complete search history.

(56) References Cited

U.S. PATENT DOCUMENTS

| | | | |
|---|---|---|---|
| 2007/0242505 A1* | 10/2007 | Ochiai et al. | 365/171 |
| 2012/0250398 A1 | 10/2012 | Morise et al. | |
| 2012/0250406 A1 | 10/2012 | Morise et al. | |

FOREIGN PATENT DOCUMENTS

JP    2008-160079    7/2008

OTHER PUBLICATIONS

Nozaki, T., et al.; "Voltage-induced prependicular magnetic anisotropy change in magnetic tunnel junctions", Applied Physics Letters, vol. 96, 2010, p. 022506.

* cited by examiner

*Primary Examiner* — Jason Lappas
(74) *Attorney, Agent, or Firm* — Turocy & Watson, LLP

(57) ABSTRACT

A magnetic memory device comprises a magnetic wire extending in a first direction, a pair of first electrodes operable to pass a current through the magnetic wire in the first direction or in an opposite direction to the first direction, a first insulating layer provided on the magnetic wire in a second direction being substantially perpendicular to the first direction, a plurality of second electrodes provided on the first insulating layer and provided at specified interval in the second direction, and a third electrode electrically connected to the plurality of second electrodes.

11 Claims, 29 Drawing Sheets

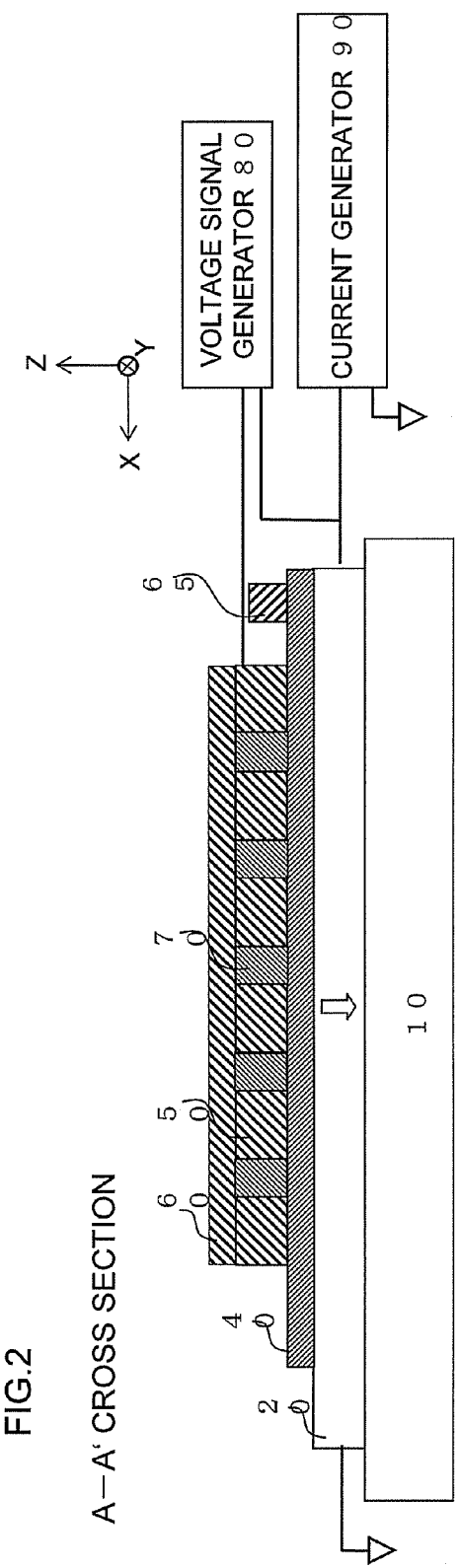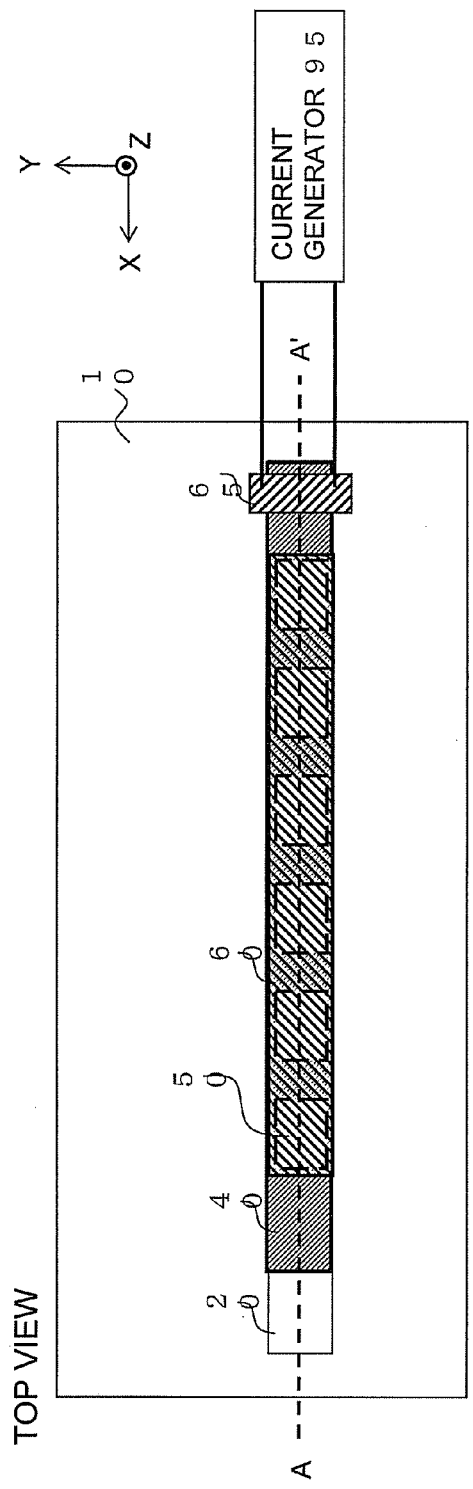
FIG.2

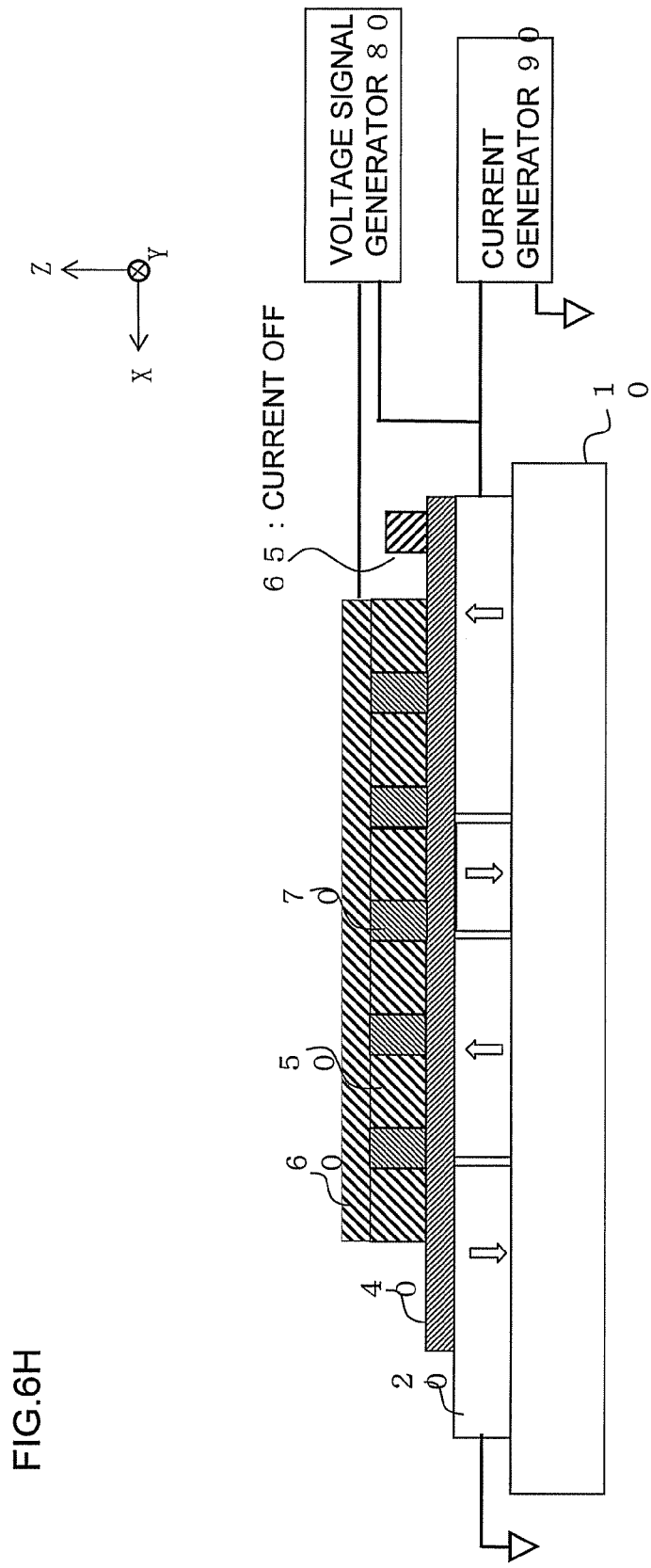

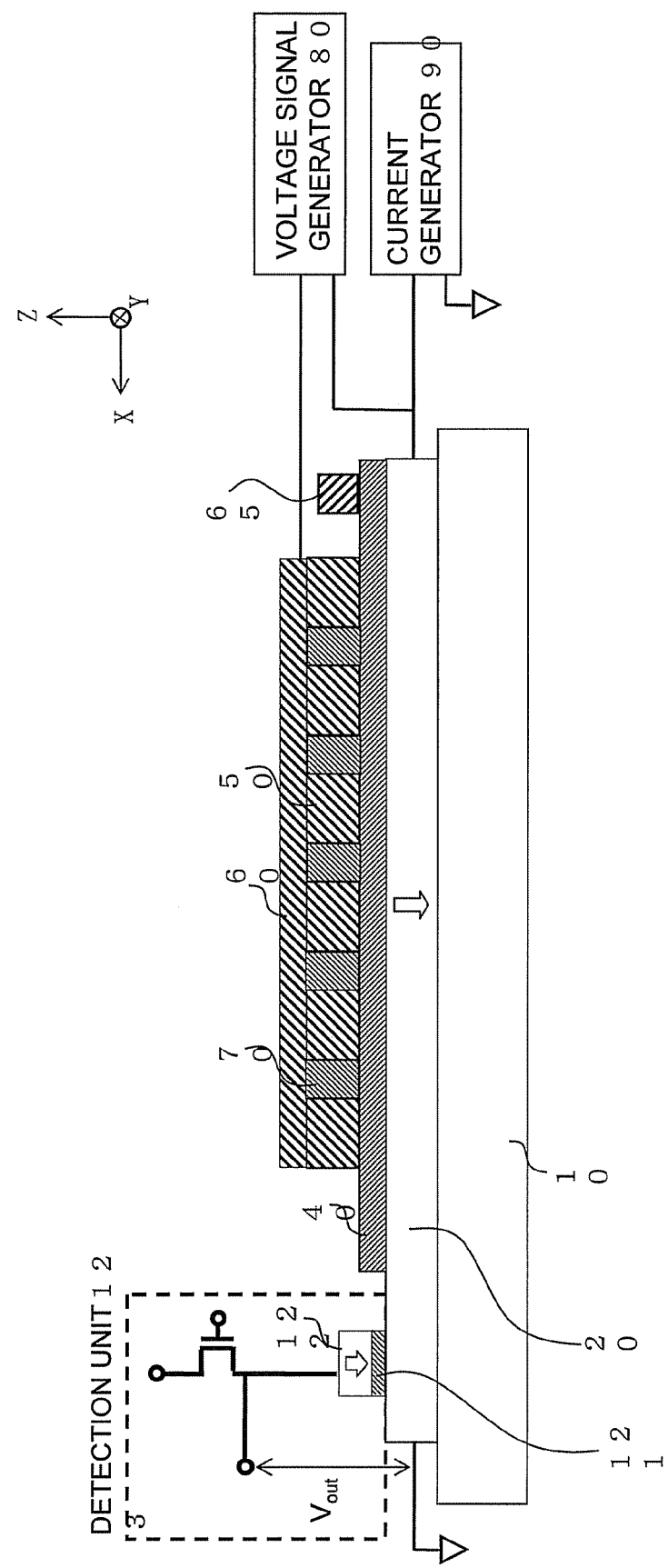

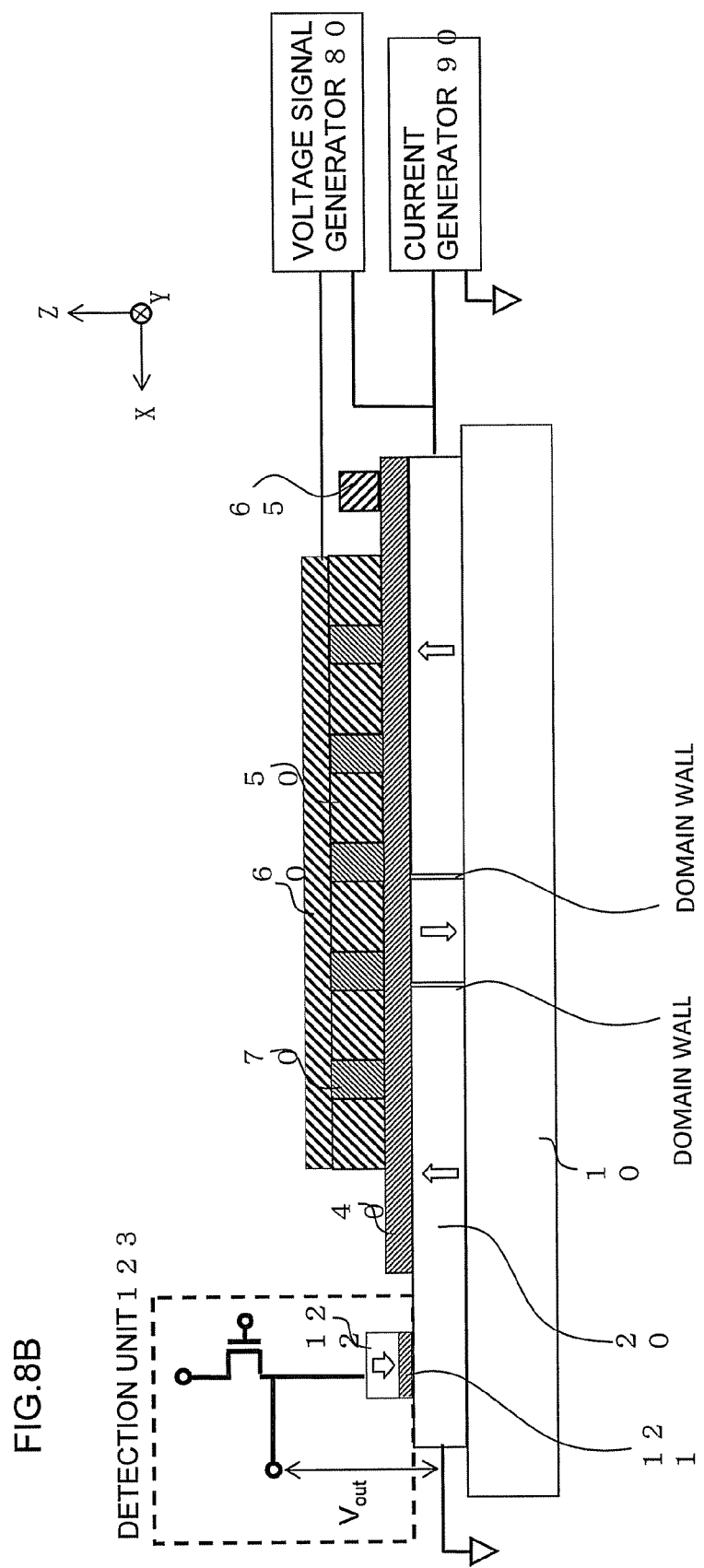

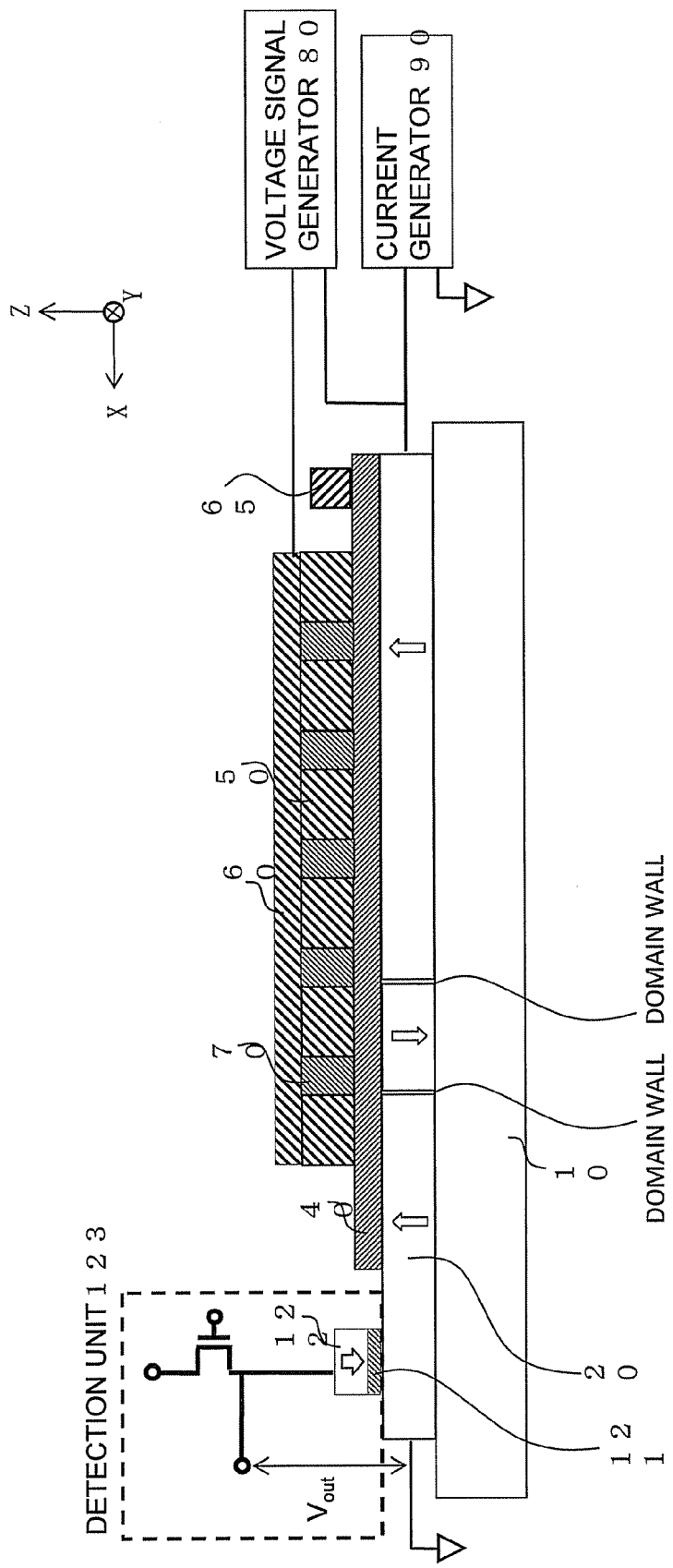

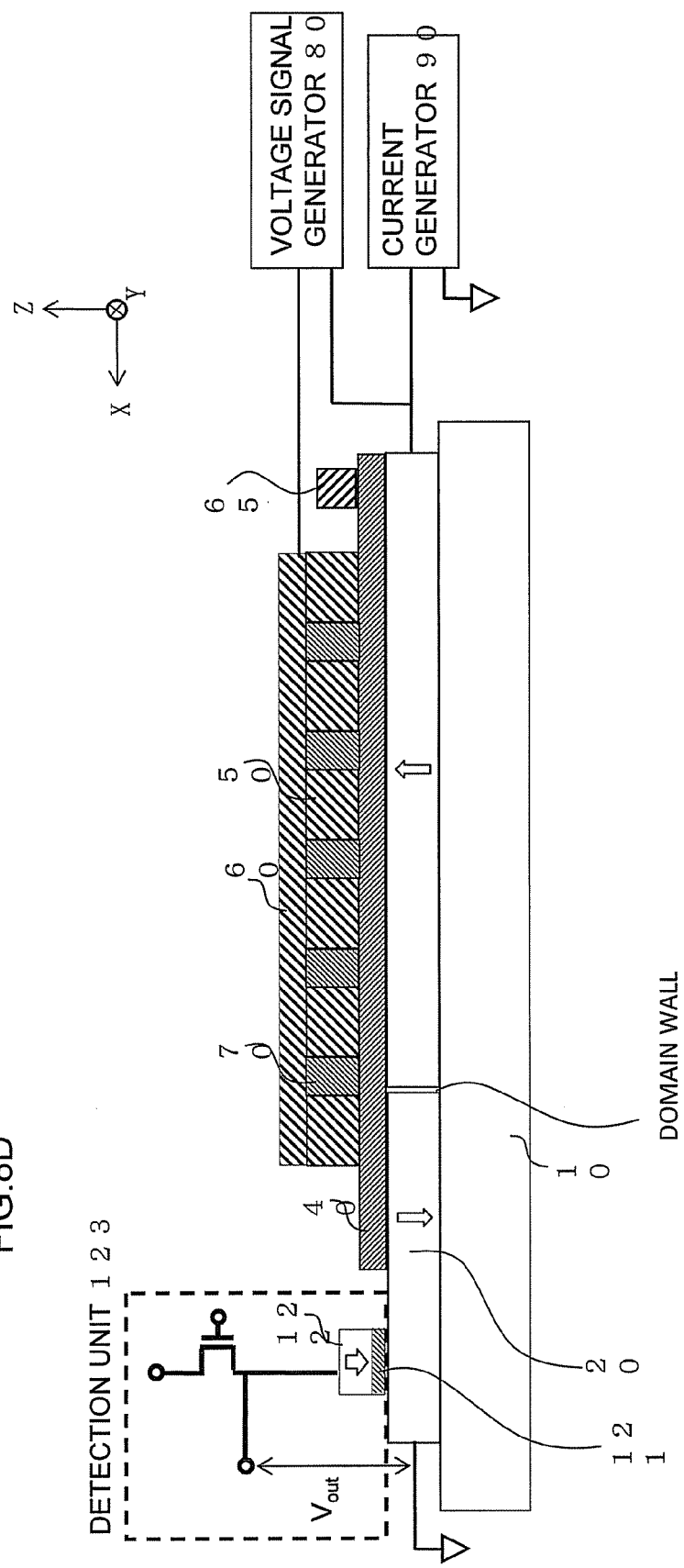

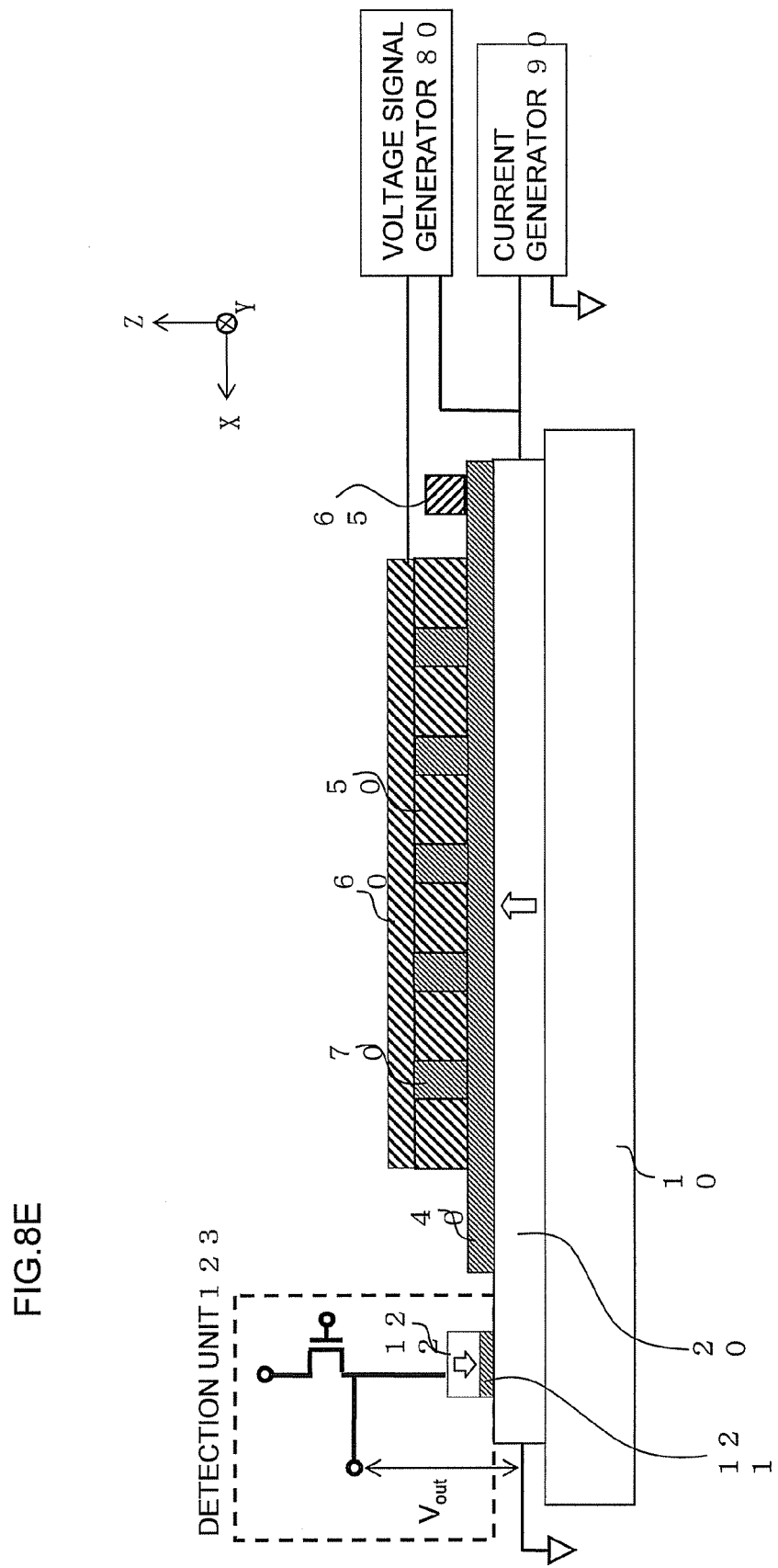

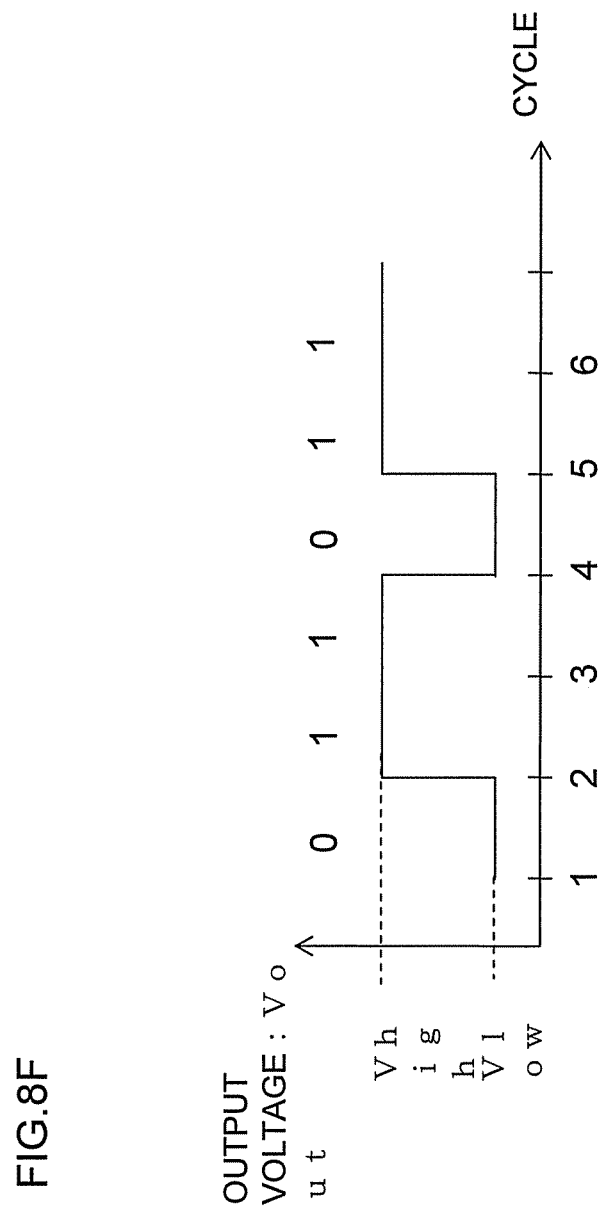

MAGNETIC MEMORY DEVICE

CROSS REFERENCE TO RELATED APPLICATION

This application is based upon and claims the benefit of priority from the prior Japanese Patent Application No. 2011-209990, filed on Sep. 26, 2011 the entire contents of which are incorporated herein by reference.

FIELD

Embodiments described herein are related to a magnetic memory device.

BACKGROUND

A device which records information by using domain wall structures in a magnetic wire has been proposed. Recently, it has been experimentally proven that the position of the domain wall can be changed by applying current to the magnetic wire. Realizing a magnetic memory device using the magnetic wire is expected, but various issues have prevented realization of the device to date. The domain wall is a boundary of the magnetic domains having different magnetization directions.

In the case where uniformity and shape of composition material are ideal, the domain wall in the magnetic wire can easily be moved by applying external magnetic field to the magnetic wire. Thus, some methods are needed to fix the domain wall in an intended position, for using the magnetic wire as the magnetic memory device. In contrast, if the domain wall is fixed securely, an appropriate magnetic memory device can not be fabricated because large current is needed for making the domain wall moved.

BRIEF DESCRIPTION OF THE DRAWINGS

Aspects of this disclosure will become apparent upon reading the following detailed description and upon reference to the accompanying drawings. The description and the associated drawings are provided to illustrate embodiments of the invention and not limited to the scope of the invention.

FIG. 2 is a view explaining an embodiment of a magnetic memory device.

FIG. 6H is a view explaining an embodiment of a magnetic memory device.

FIG. 7 is a view explaining an embodiment of a magnetic memory device.

FIG. 8B is a view explaining an embodiment of a magnetic memory device.

FIG. 8C is a view explaining an embodiment of a magnetic memory device.

FIG. 8D is a view explaining an embodiment of a magnetic memory device.

FIG. 8E is a view explaining an embodiment of a magnetic memory device.

FIG. 8F is a view of a voltage profile explaining an embodiment.

DETAILED DESCRIPTION

Figure 1:
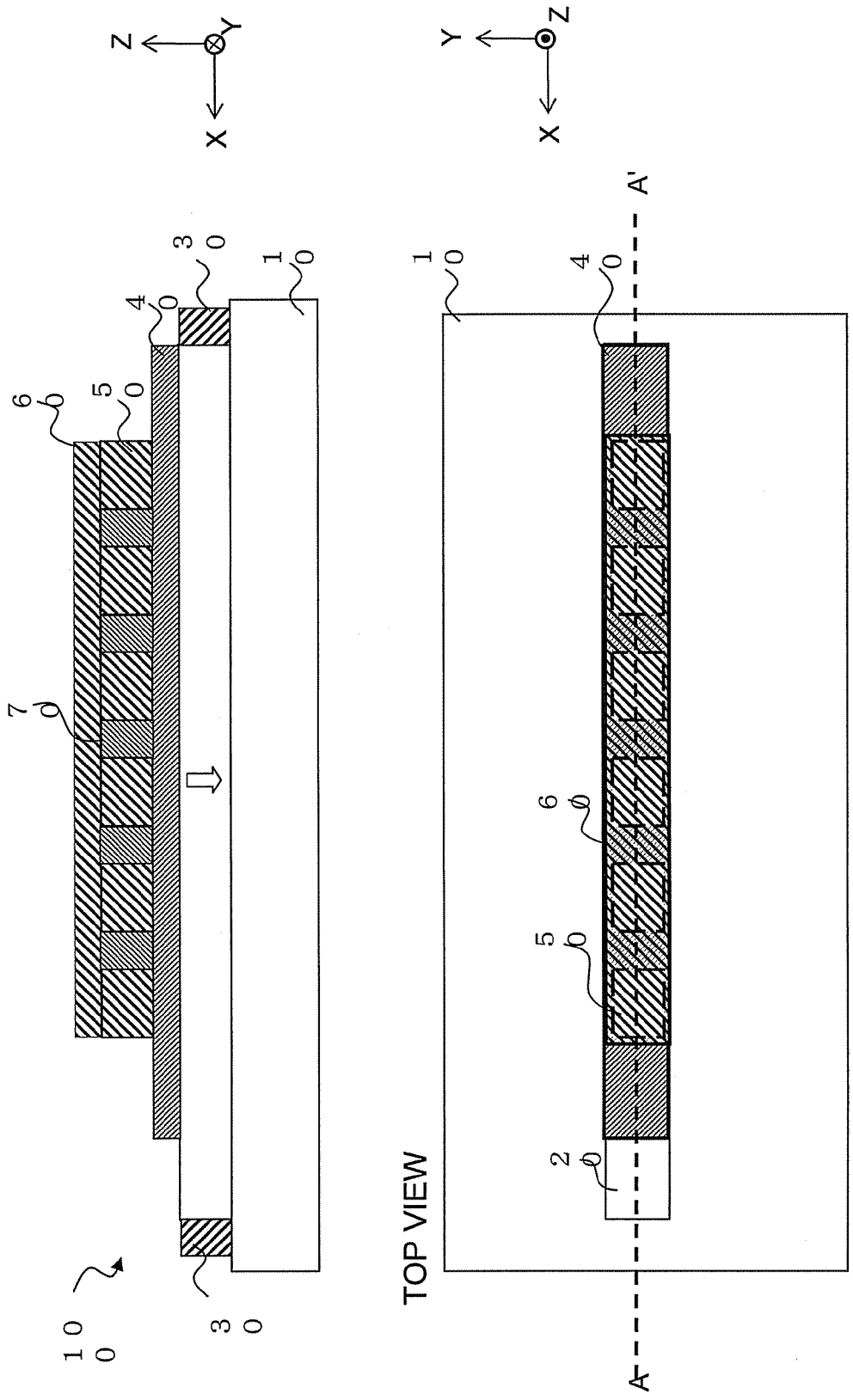
FIG. 1 is a view showing a magnetic memory device mentioned in an embodiment.

Embodiments will be described below with reference to drawings. Wherever possible, the same reference numerals or marks will be used to denote the same or like portions throughout figures, and overlapped explanations are omitted in embodiments following an embodiment.

FIG. 1 shows a schematic illustration of a magnetic memory device 100. An upper figure in FIG. 1 shows a cross sectional illustration of A-A' of the magnetic memory device 100. A lower figure in FIG. 1 shows a top view of the magnetic memory device 100.

The magnetic memory device 100 comprises a magnetic wire 20 extending in one direction, a pair of first electrodes 30 provided in a direction that the magnetic wire 20 extends, a first insulating layer 40 provided on the magnetic wire 20, a plurality of second electrodes 50 provided on the first insulating layer 40 and being apart from each other, and a third electrode 60 electrically connected to plurality of second electrodes 50. In the direction that the magnetic wire 20 extends, a plurality of second electrodes 50 are insulated each other by a second insulating layer 70. Multi-layer, that Ta, Ru, or Ta or like is laminated, can be provided between the magnetic wire 20 and a substrate 10.

As shown in FIG. 1, an x-axis, a y-axis, and a z-axis are perpendicular each other. An upper figure of FIG. 1 is the magnetic memory device 100 viewing from the y-axis direction. A lower figure of FIG. 1 is the magnetic memory device 100 viewing from the z-axis direction.

The magnetic wire 20 includes conductive materials. Examples of materials that make the magnetic wire 20 include ferromagnetic material, ferrimagnetic material, or an artificial lattice film.

The ferromagnetic material, such as one of the metal alloys which have the content being the combination of two different elements selected from the group of iron (Fe), cobalt (Co), nickel (Ni), manganese (Mn), and chromium (Cr), and another of platinum (Pt), palladium (Pd), iridium (Ir), ruthenium (Ru), and rhodium (Rh) can be used for the material of the magnetic wire 20. For example, CoPt, NiFe, or CoCrPt or like can be also used for the ferromagnetic material. The properties of the ferromagnetic material can be controlled by changing the precise content of each element and/or annealing.

For the ferrimagnetic material, amorphous alloys of rare earth metals and transition metals, such as TbFeCo or GdFeCo or like, are acceptable as the material of the magnetic wire 20. Magnetization of these materials is easily to be realized in the z-axis direction (laminating direction) when these materials are laminated as thin film by, for example, use of a sputtering machine and selecting given fabrication process. These materials can be used in the case where a magnetization direction of the magnetic wire 20 is in z-axis direction.

The artificial lattice film such as laminating structure of Co/Pt, Co/Pd, or Co/Ni can be used for the magnetic wire 20. The magnetization direction of the magnetic wire 20 can be in the z-axis direction by use of these laminating structures. These laminating structures have hexagonal closed packed, <0001> direction, or face centered cubic, <111> direction.

For the first insulating layer 40, an insulator such as oxides, nitrides, fluorides, oxynitrides, which include one or a plural set of elements selected from aluminium (Al), titanium (Ti), zinc (Zn), tantalum (Ta), cobalt (Co), nickel (Ni), silicon (Si), magnesium (Mg), and iron (Fe) can be used. In an example, magnesium oxide (MgO) can be used for the first insulating layer 40. The dielectric constant of the first insulating layer 40 is larger than the dielectric constant of the second insulating layer 70. This is because electric charge can be easily distributed between the magnetic wire 20 and the second electrode 50 when voltage is applied to the second electrode 50. For example, the difference of dielectric constant can be realized when the first insulating layer 40 includes MgO and the second insulating layer 70 includes $SiO_2$. Generally speaking, as the element of the oxides, fluorides, and nitrides becomes lighter, the dielectric constant of the corresponding oxides, fluorides, and nitrides becomes smaller.

Materials used for the first insulating layer 40 can also be used for the second insulating layer 70. In the z-axis direction, the thickness of the second insulating layer 70 is thicker than the thickness of the first insulating layer 40. This is because electric charge can be easily distributed selectively between the second electrode 50 and the magnetic wire 20 when voltage is applied from the second electrode 50 to the magnetic wire 20. The second insulating layer 70 can also be or contain an air gap.

The first electrode 30, the second electrode 50, and the third electrode 60 include conductive materials. One or a plural set of elements selected from group of cupper (Cu), gold (Au), silver (Ag), and aluminium (Al) can be independently used as the conductive materials for the first electrode 30, the second electrode 50, and the third electrode 60. Alloys related to these elements can also be used. The second electrode 50 and the third electrode 60 can be integrally formed. The third electrode 60 enables all second electrodes 50 to be equipotential.

The first electrode 30 will be omitted in figures used in following explanation.

For simplicity, the working principle of the magnetic memory device 100 is described below.

Firstly, the working principle of writing of the magnetic memory device 100 is described.

FIG. 2 shows a structure for writing information into the magnetic memory device 100. A detecting unit is omitted herein although the magnetic memory device 100 includes the detecting unit.

A voltage signal generator 80 is connected to the third electrode 60 and the magnetic wire 20. A current generator 90 is connected to the magnetic wire 20. In the z-axis direction, an electrode 65 is provided on the first insulating later 40. A current generator 95 is connected to the electrode 65.

Voltage is applied between the second electrode 50 and the magnetic wire 20 by the voltage signal generator 80.

The current generator 90 enables the domain walls to move by applying current into the magnetic wire 20. Here, the magnetic domain refers to an area that magnetizations are in one direction in the area. In the border where two magnetic domains neighbour each other, magnetization direction can change continuously. Such changing area of magnetization refers to a domain wall.

Magnetization of a portion of the magnetic wire 20 is reversed by applying magnetic field to the magnetic wire 20. The magnetic field is generated by applying current to the electrode 65 by used of the current generator 95. The domain wall is formed in the magnetic wire 20 by inversing the domain wall.

Figure 3:
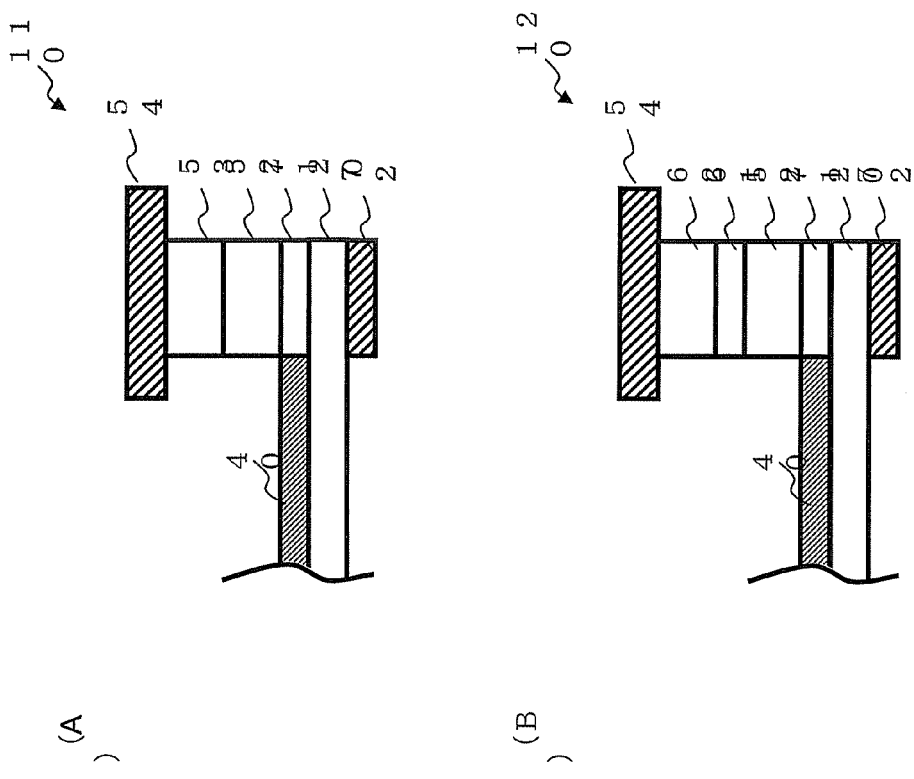
FIG. 3 is a view explaining an embodiment of a portion of a magnetic memory device.

As shown in FIG. 3, an input unit 110,120 which are illustrated in FIGS. 3(A), 3(B) can replace the electrode 65.

FIG. 3 shows the input unit 110,120 which are connected to the magnetic wire 20. FIG. 3A shows the input unit 110. FIG. 3B shows the input unit 120. Working principle of the input unit 110,120 is same, but a structure of the input unit 110,120 is different.

The input unit 110 includes a spacer layer 71, a ferromagnetic layer 52, an antiferromagnetic layer 53, and an electrode 54. The spacer layer 71 is provided on the magnetic wire 20. An electrode 72 is provided on a side opposite to a side where the input unit 110 is provided in the magnetic wire 20. Non-magnetic layer or like can be provided between the magnetic wire 20 and the electrode 72.

Tunnelling insulating material or nonmagnetic metal material can be used for the spacer layer 71.

As the tunnelling insulating material for the spacer layer 71, oxides, nitrides, fluorides, oxynitrides, which contain one or a plural set of elements selected from aluminium (Al), titanium (Ti), zinc (Zn), tantalum (Ta), cobalt (Co), nickel (Ni), silicon (Si), magnesium (Mg), and iron (Fe) can be used. Semiconductors having wide energy-band gap, such as AlAs, GaN, AlN, ZnSe, ZnO are also acceptable as the spacer layer 71.

As the nonmagnetic metal material, cupper (Cu), gold (Au), silver (Ag), and aluminium (Al), are acceptable as the spacer layer 71.

The material which is used for the electrode 54 can be used for the electrode 74.

Method of writing data into the magnetic wire 20 by the input unit 110 will be explained.

The magnetization of the ferromagnetic layer 52 is transferred to a portion of the magnetic wire 20 by applying current from the electrode 54 to the electrode 72. The structure of the input unit 110 can also be used for the input unit 120. In this case, the input unit 110 includes the spacer layer 71, the ferromagnetic layer 52, an intermediate layer 61, a ferromagnetic layer 62, and the electrode 54. The spacer layer 71 is provided on the magnetic wire 20.

Working principle of the magnetic memory device 100 will be explained.

Firstly, detail on domain wall manipulation in the magnetic wire 20 will be explained.

Figure 4:
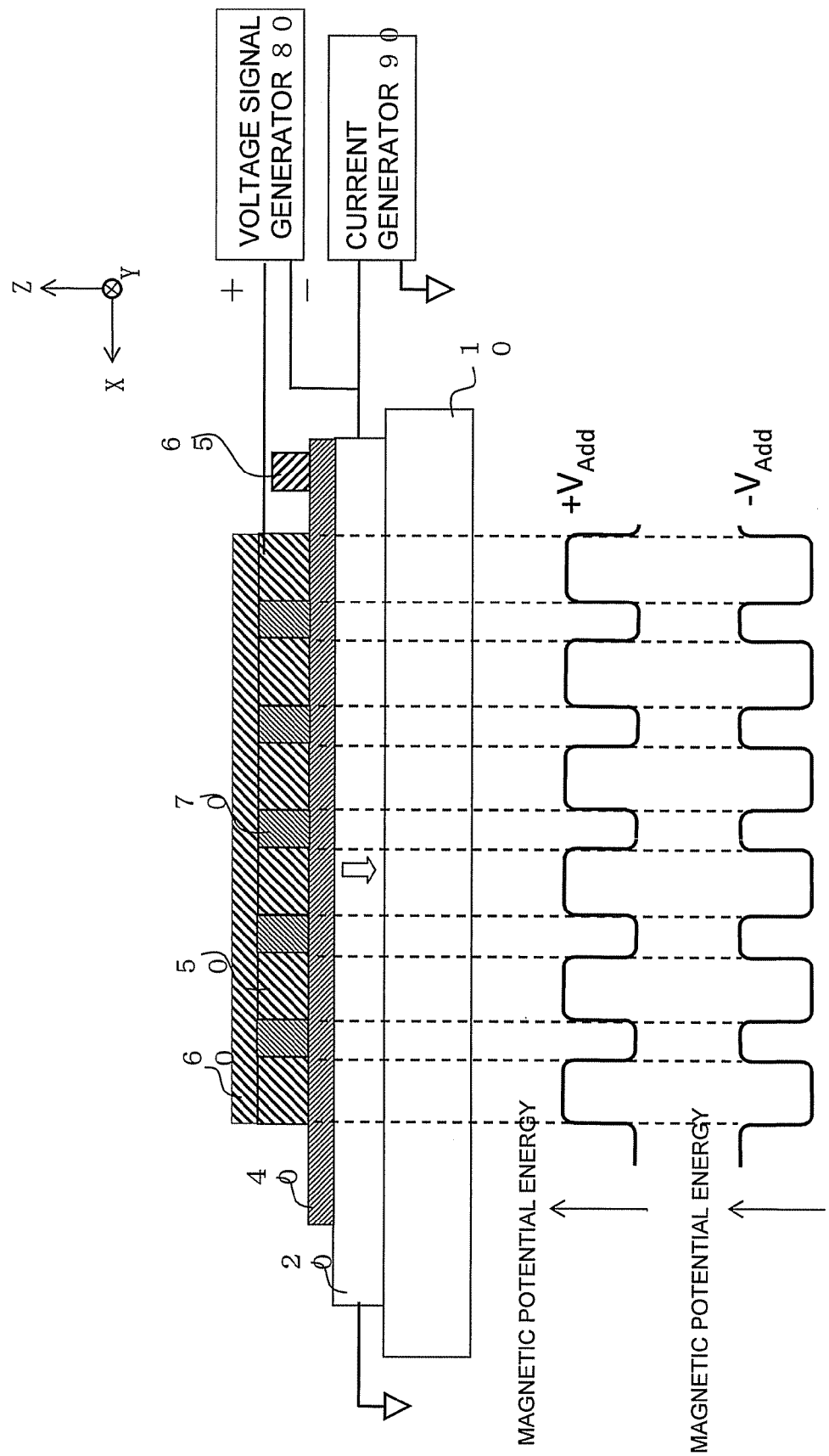
FIG. 4 is a view explaining an embodiment of a magnetic memory device.

FIG. 4 shows the relation between the domain wall in the x-axis direction and magnetic potential energy for domain wall of the magnetic wire 20 which generates when voltage is applied between the second electrode 50 and the magnetic wire 20. In FIG. 4, two patterns of magnetic potential energy state of the magnetic wire 20 are shown. An upper figure in FIG. 4 shows a state when voltage (+Vadd) is applied between the second electrode 50 and the magnetic wire 20, so that the electric potential of the second electrode 50 is higher than the electric potential of the magnetic wire 20. In this case, the second electrode 50 has positive charge and the magnetic wire 20 has negative charge. A lower figure in FIG. 4 shows a state when voltage (−Vadd) is applied between the second electrode 50 and the magnetic wire 20, so that the electric potential of the second electrode 50 is lower than the electric potential of the magnetic wire 20. In this case the second electrode 50 has negative charge and the magnetic wire 20 has positive charge.

In a state that voltage is not applied (equilibrium state), the magnetization in the magnetic wire 20 points a direction being perpendicular to the extending direction of the magnetic wire 20, to minimize a total energy summing magnetostatic energy, exchange energy mostly related to domain walls and their configuration, material-orientated anisotropic energy and anisotropic energy which generates in electron state of an interface between the first insulating layer 40 and the magnetic wire 20.

Voltage is applied with the voltage signal generator 80 so that the second electrode 50 has a positive charge and the magnetic wire 20 has a negative charge (this state corresponds to the upper figure in FIG. 4). Then, a part of the magnetic wire 20 under the second electrode 50 has higher magnetic potential energy for the domain wall than the other parts of the magnetic wire 20. Thus, the domain wall can easily move from the part of the magnetic wire 20 under the second electrode 50 to the part except for the part of the magnetic wire 20 under the second electrode 50 when current is applied to the magnetic wire 20 to move the domain wall. On the contrary case, however, the domain wall remains held in position. Thus, the domain wall does not move from the part of the magnetic wire 20 which is not under the second electrode 50 to the part of the magnetic wire 20 which is under the second electrode 50. This is because potential barrier, which prevents the domain wall in the magnetic wire 20 from moving, generates by applying voltage between the second electrode 50 and the magnetic wire 20. The domain wall can move if large current over the potential barrier is applied to the magnetic wire 20. However, controlling the magnetic domain motion can be difficult.

Moreover, voltage is applied by the voltage signal generator 80 so that the second electrode 50 has negative charge and the magnetic wire 20 has positive charge (this state corresponds to the lower figure in FIG. 4). Then, the part of the magnetic wire 20 under the second electrode 50 has a lower magnetic potential energy for the domain wall than the other parts of the magnetic wire 20. Thus, the domain wall does not move from the part of the magnetic wire 20 under the second electrode 50 to the part except for the part of the magnetic wire 20 under the second electrode 50 when current is applied to the magnetic wire 20 to move the domain wall. In the contrary case, the domain wall can move easily from the part which is not under the second electrode 50 to the part of the magnetic wire 20 which is under the second electrode 50.

As mentioned above, in operation of the magnetic memory device 100, voltage between the second electrode 50 and the magnetic wire 20 for a part of the magnetic wire 20 is applied to induce the magnetic potential energy profile being repetition of a low- and a high-energy values. magnetic potential energy By use of this profile magnetic potential energy for domain wall, the domain wall can be controlled.

Figure 5:
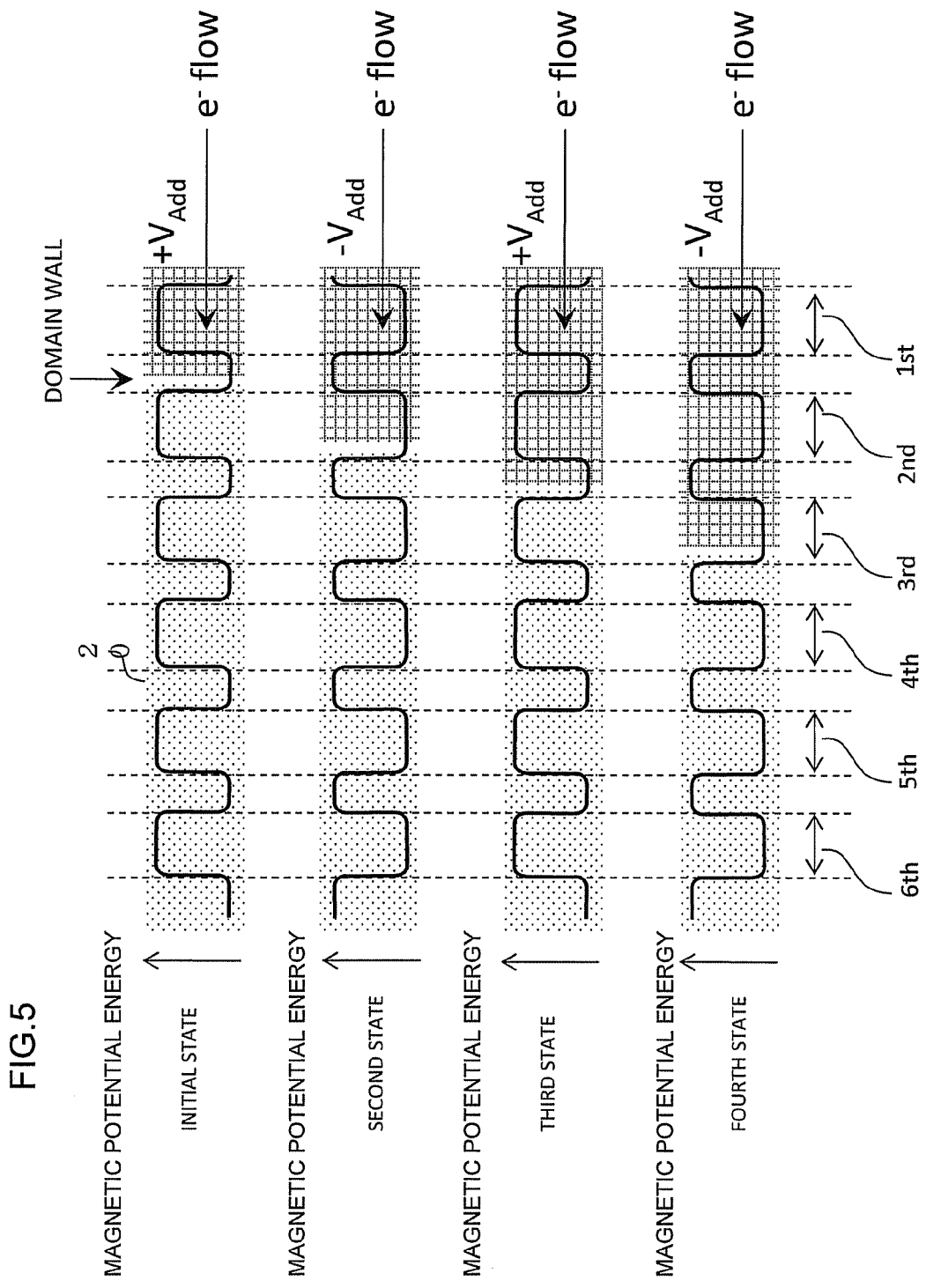
FIG. 5 is a view of a magnetic potential energy profile explaining an embodiment.

FIG. 5 is a figure explaining how to move the domain wall in the magnetic wire 20 by use of the magnetic potential energy profile for the domain wall which is explained in FIG. 4. Each figure in FIG. 5 shows profile of magnetic potential energy for the domain wall in the magnetic wire 20 and a position of the domain wall. Top figure in FIG. 5 shows a state of the domain wall in the magnetic wire 20 at an initial state. Figures in FIG. 5 show states of each step, mentioned below, in time sequential order. In FIG. 5, each figure is defined as an initial state, a second state, a third state, and forth state from the upper figure. As an example, in FIG. 5 there are six second electrodes 50.

In the initial state, the domain wall is between $1^{st}$ of the second electrode 50 and $2^{nd}$ of the second electrode 50. Moreover, voltage (+Vadd) is applied so that electric potential of the second electrode 50 is higher than electric potential of the magnetic wire 20. Then, a part of the magnetic wire 20 under the second electrode 50 has higher magnetic potential energy for the domain wall than the other parts of the magnetic wire 20. In order to move the domain wall under this condition, a threshold current Id (Ic0<Ic1) which is larger than a current Ic0 (Ic0>0) that can move the domain wall in the equilibrium state needs to move domain wall in the magnetic wire 20. Thus, in this state, the domain wall only moves a part between the $1^{st}$ and the $2^{nd}$ second electrodes 50 even though the magnitude of the current Ic (Ic0<Ic<Ic1) between the magnitude of current Ic0 and the magnitude off current Ic1 is applied to magnetic wire 20.

Voltage (−Vadd) is applied to the magnetic wire 20 so that the electric potential of the second electrode 50 is lower than the electric potential of the magnetic wire 20. As the result of changing the voltage polarity, the profile of the magnetic potential energy become flat, then position of energy barrier moves only a distance corresponding to a width of the electrode W (W>0). In this result, the domain wall in the magnetic wire 20 moves to the left side in the $2^{nd}$ of the second electrode 50 by applying current. Then, the domain wall in the magnetic wire 20 stops by the potential energy (the second state in FIG. 5).

Voltage (+Vadd) is applied to the magnetic wire 20 again, so that the potential of the second electrode 50 is higher than potential of the magnetic wire 20. As the result of changing the voltage polarity, the profile of the magnetic potential energy become flat, then position of energy barrier moves only a distance corresponding to a width of the electrode W (W>0). In this result, the domain wall in the magnetic wire 20 moves by applying current and stops between the $2^{nd}$ of the second electrode and the $3^{rd}$ of the second electrode 50 (the third state in FIG. 5).

As mentioned above, the domain wall can be moved by repeating the operation of applying voltage, under an intentional control.

Methods of writing data into the magnetic memory device 100 will be explained. The writing operation is performed by combining manipulation of the domain wall position and magnetization reversal.

Figures from FIG. 6A to FIG. 6H are figures which explain the writing operation of the magnetic memory device 100. It is defined that a part (magnetic domain), in which magnetization direction is in downward direction in this paper (downward of z axis direction), indicates data '0'. It is also defined that a part, in which magnetization direction is in upward direction in this paper (upward of z axis direction), indicates data '1'. In figures from FIG. 6A to FIG. 6H, there are six second electrodes 50 for explanation. In this case, the magnetic memory device 100 can store six bits information, for example. The number bits of the second electrode 50 can be equal to or more than six or not. In figures from FIG. 6A to FIG. 6H, the second electrode 50 is numbered as $1^{st}$, $2^{nd}$, $3^{rd}$, $4^{th}$, $5^{th}$, and $6^{th}$ from right side of the second electrode 50 in this paper.

Figure 6A:
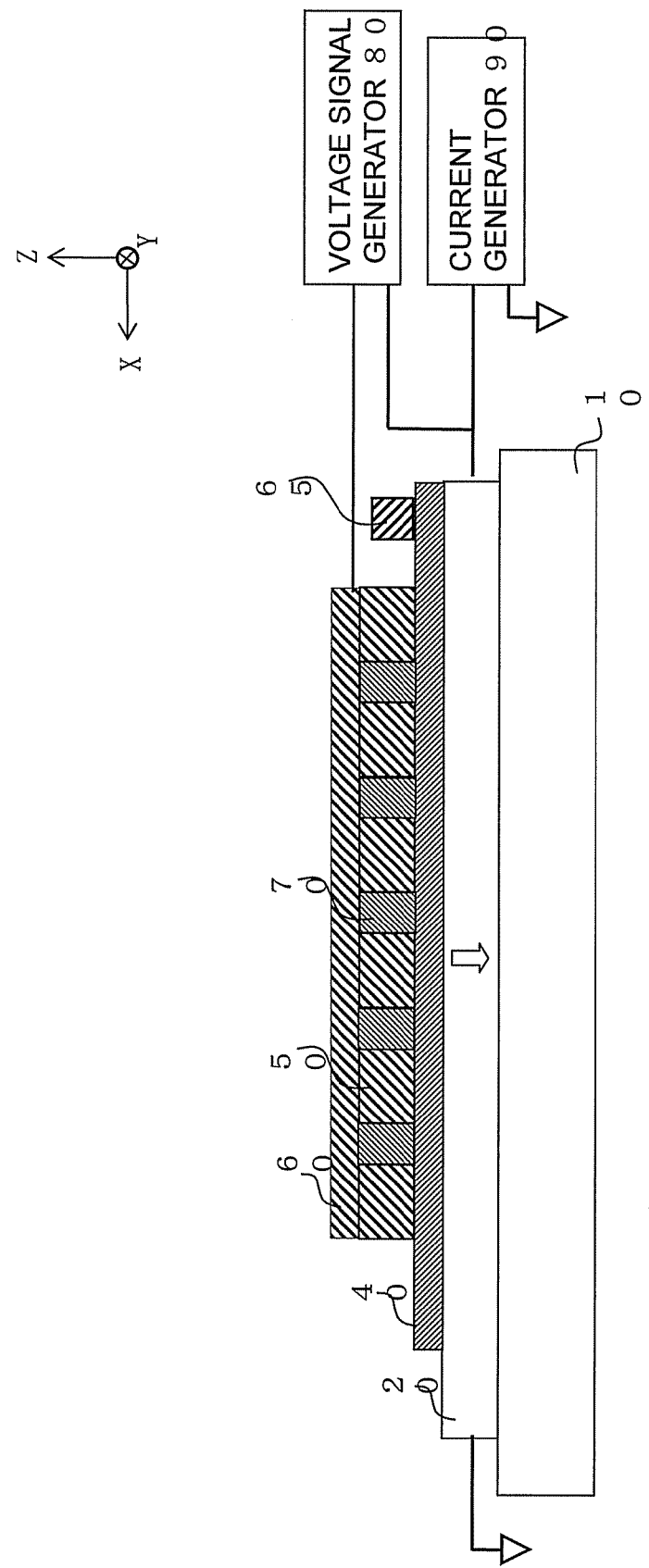
FIG. 6A is a view explaining an embodiment of a magnetic memory device.

In the initial state, all magnetization directions of the magnetic wire 20 are forward to downward direction in this paper (FIG. 6A). Thus, the magnetic memory device 100 stores data '0'.

Voltage (+Vadd) is applied to the magnetic wire 20 so that the electric potential of the second electrode 50 is higher than the electric potential of the magnetic wire 20, in order to prevent the domain wall in the magnetic wire 20 from moving at once from the right side in this paper to the left side in this paper. Inductive magnetic field is caused from the electrode 65 by applying current to the electrode 65. By use of this inductive magnetic field, the magnetic domain of magnetization whose direction is in upward direction in this paper is inserted into the right side of the $1^{st}$ of the second electrode 50. Even if the magnetic domain whose direction is upward direction in this paper spread to the left side in this paper, the spread is stopped by potential energy barrier caused by voltage (+Vadd).

Potential of the second electrode 50 is sequentially switched to low (−Vadd) and then to high (+Vadd) with applying the current Ic to the magnetic wire 20. The domain wall being in the magnetic wire 20 moves to a part between the $1^{st}$ and the $2^{nd}$ second electrode 50. In the result, the magnetization of a part of the magnetic wire 20 under the $1^{st}$ of the second electrode 50 reverses to upward direction in this paper (FIG. 6). Then, for example, the domain wall in the magnetic wire 20 can be controlled more accurately if switching speed of potential is faster than the movement speed of the domain wall in the magnetic wire 20. The domain wall can be also controlled more accurately if the current Ic is stopped when voltage between the magnetic wire 20 and the second electrode 50 is 0V.

In following explanation, an operation that switching speed of potential is faster than the movement speed of the domain wall in the magnetic wire 20 is capable to the operation that voltage of the second electrode 50 is switched to low (−Vadd) or high (+Vadd). An operation that stops the current Ic when voltage between the magnetic wire 20 and the second electrode 50 is 0V is capable to the operation that voltage of the second electrode 50 is switched to low (−Vadd) or high (+Vadd).

The potential of the second electrode 50 is sequentially switched to low (−Vadd) and then to high (+Vadd) with applying the current Ic to the magnetic wire 20. The domain wall, being in the magnetic wire 20, moves to a part between the $2^{nd}$ and the $3^{rd}$ second electrode 50 (FIG. 6D). Then, the data stored in the magnetic memory device 100 is '000011'.

Figure 6B:
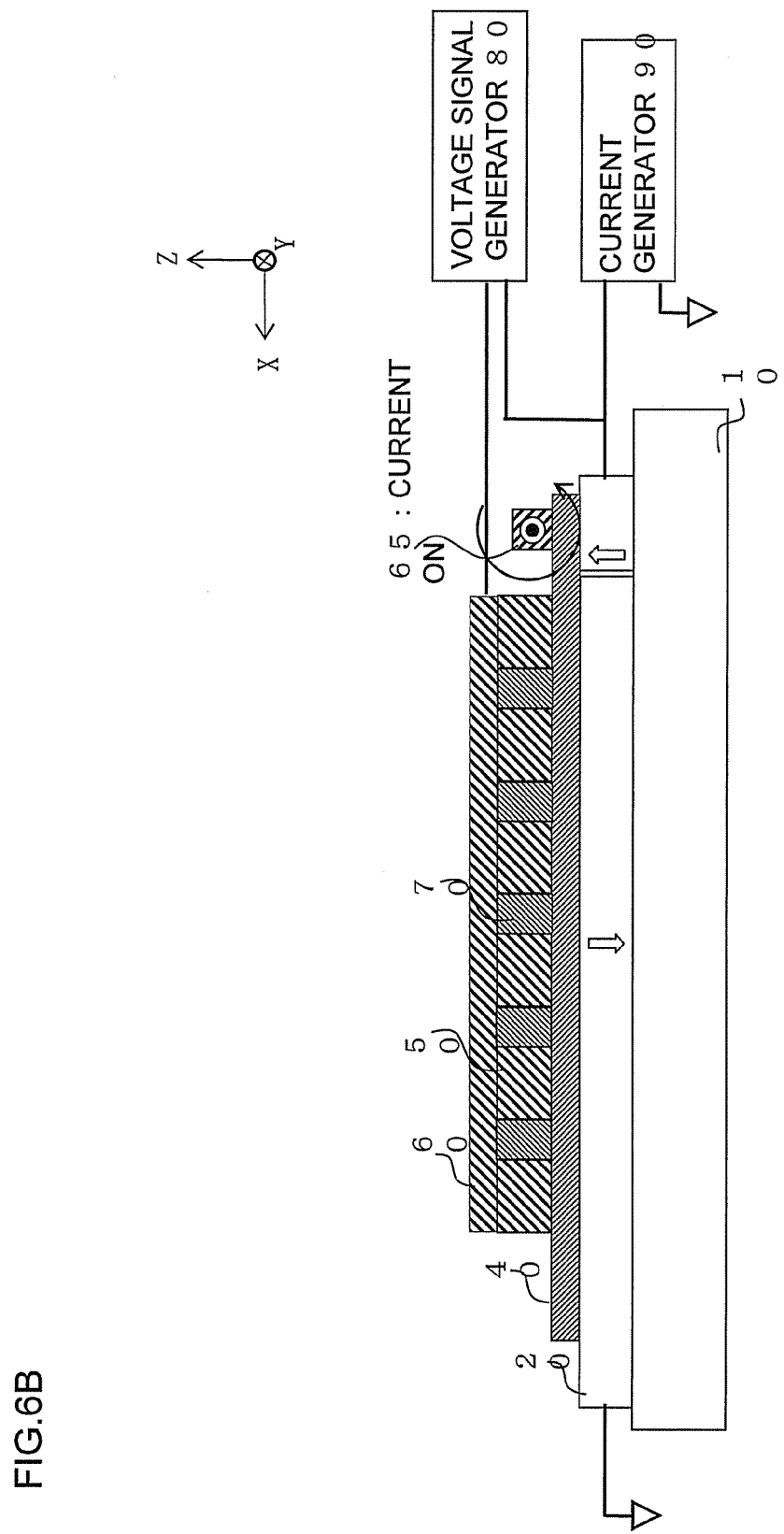
FIG. 6B is a view explaining an embodiment of a magnetic memory device.
Figure 6C:
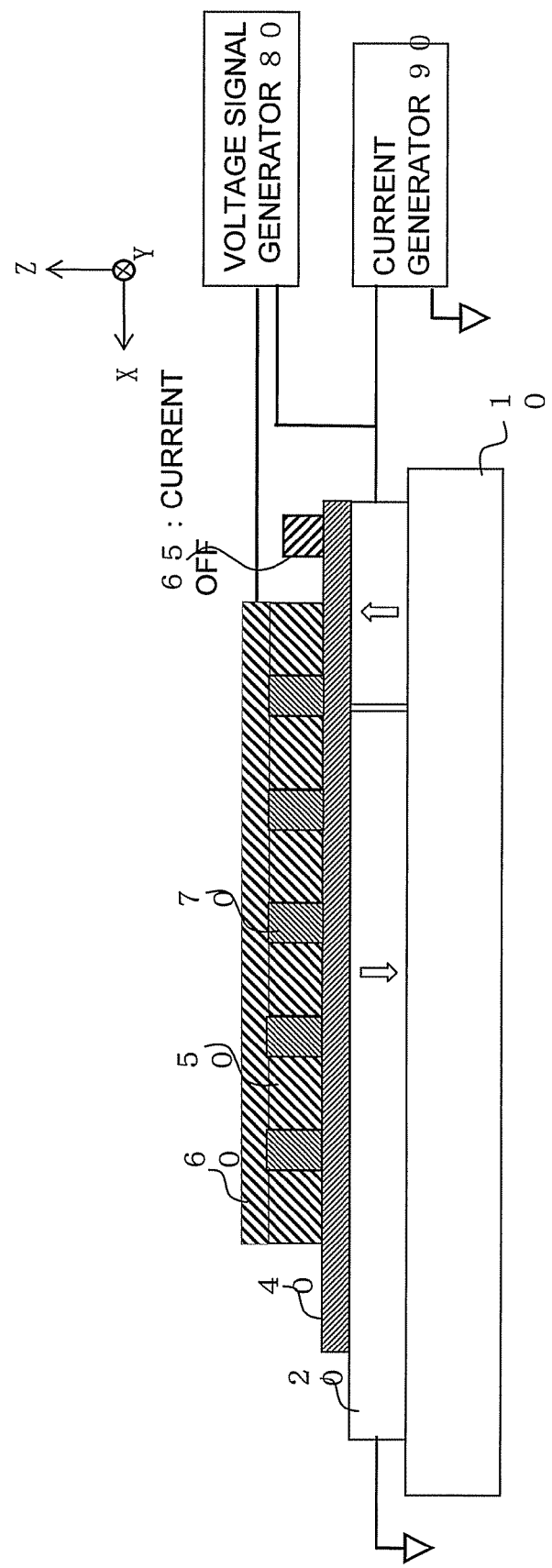
FIG. 6C is a view explaining an embodiment of a magnetic memory device.
Figure 6D:
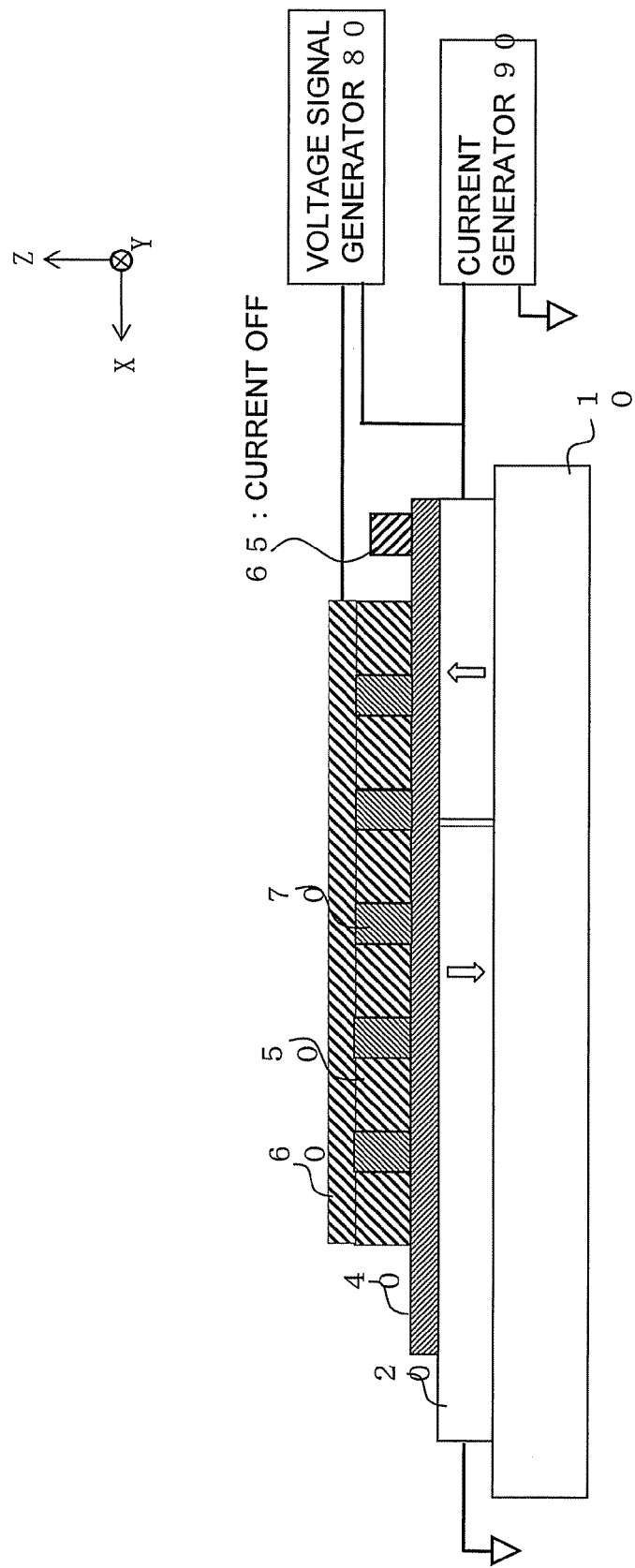
FIG. 6D is a view explaining an embodiment of a magnetic memory device.
Figure 6E:
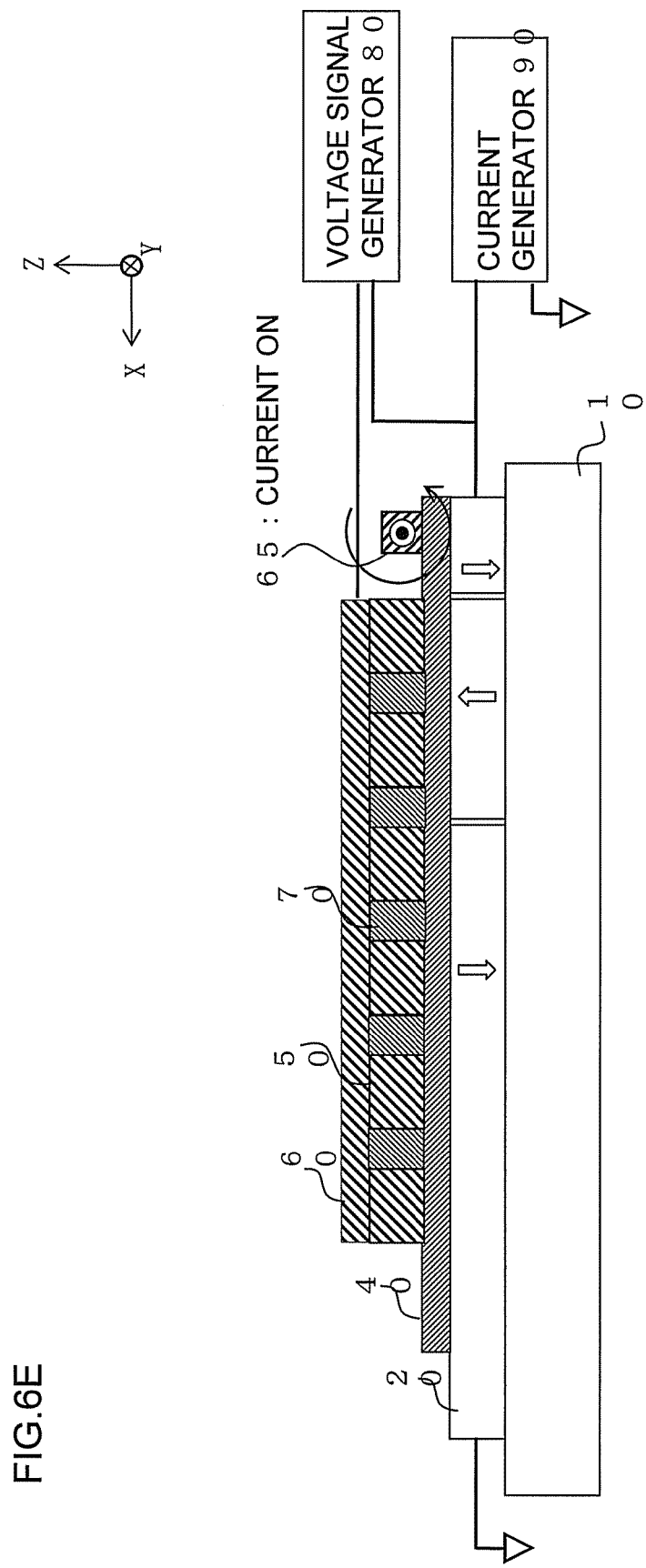
FIG. 6E is a view explaining an embodiment of a magnetic memory device.

An inductive magnetic field is inverted when current direction in the electrode 65 is opposite to the direction explained in FIG. 6B. By use of this inductive magnetic field, the magnetic domain of magnetization whose direction is in the downward direction in this paper is inserted into the right side of the $1^{st}$ of the second electrode 50 (FIG. 6E).

Figure 6F:
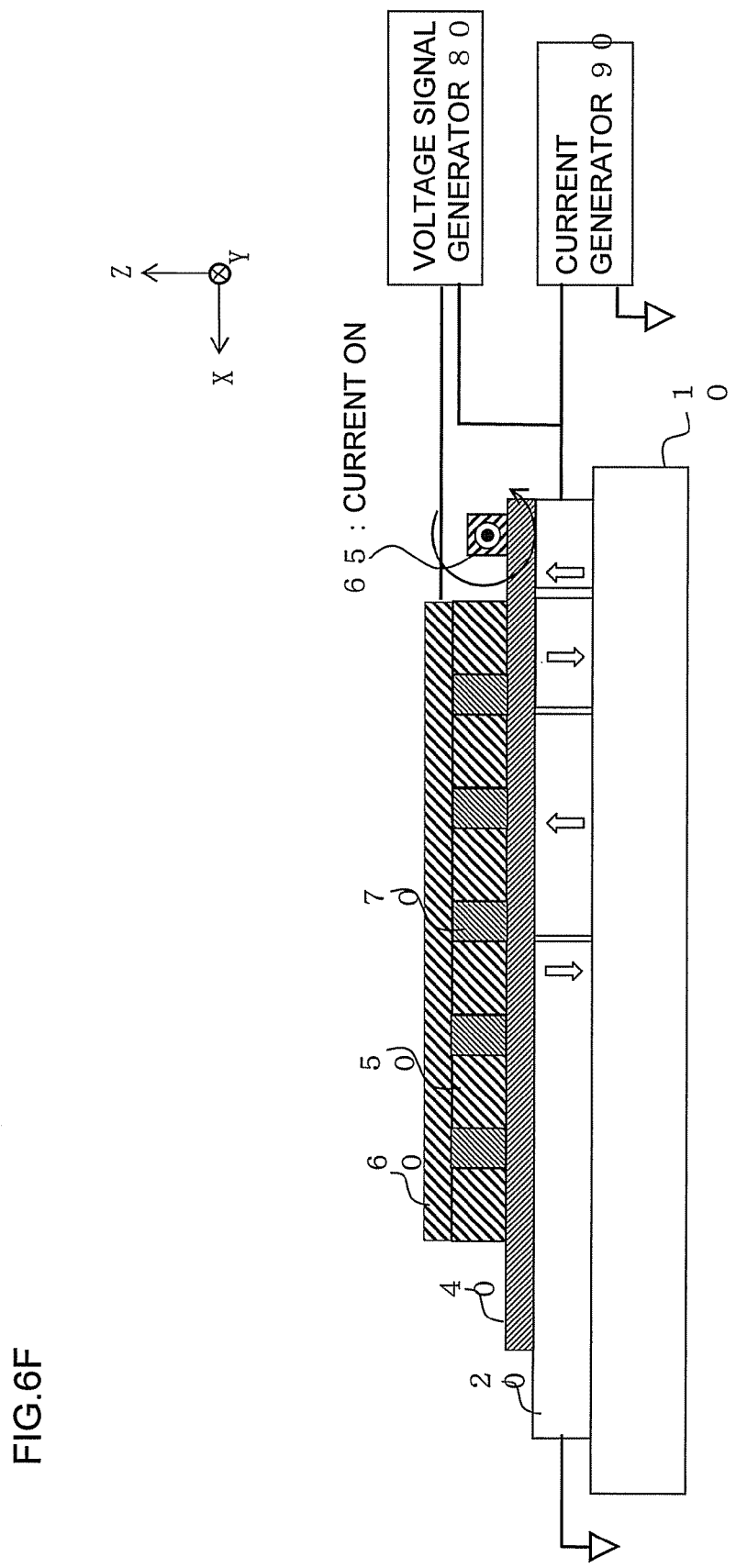
FIG. 6F is a view explaining an embodiment of a magnetic memory device.

The potential of the second electrode 50 is sequentially switched to low (−Vadd) and then to high (+Vadd) with applying the current Ic to the magnetic wire 20. Furthermore, an inductive magnetic field is caused from the electrode 65 by applying current, whose direction is same direction to the current explained in FIG. 6B. By use of this inductive magnetic field, the magnetic domain with upward magnetization direction in this paper is inserted into the right side of the $1^{st}$ of the second electrode 50 (FIG. 6F). Then, the data '000110' is stored in the magnetic memory device 100.

Figure 6G:
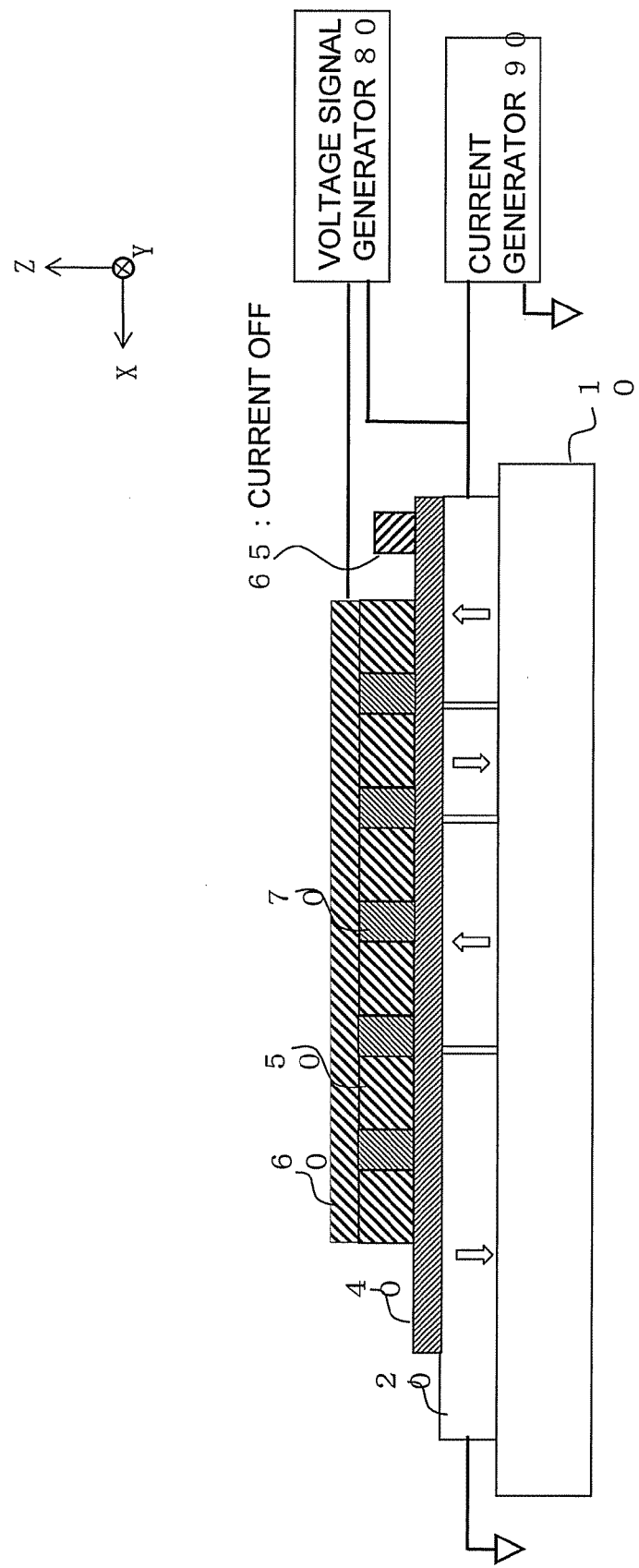
FIG. 6G is a view explaining an embodiment of a magnetic memory device.

The potential of the second electrode 50 is sequentially switched to low (−Vadd) and then to high (+Vadd) with applying the current Ic to the magnetic wire 20, again. As a result, the state shown in FIG. 6G is realized.

The potential of the second electrode 50 is sequentially switched to low (−Vadd) and then to high (+Vadd) with applying the current Ic to the magnetic wire 20 (FIG. 6H). Then, the data '011011' is stored in the magnetic memory device.

Reading operation of the magnetic memory device 100 will be explained.

FIG. 7 is a figure showing the structure for reading information stored in the magnetic memory device 100.

The magnetic memory device 100 includes a detection unit 123 provided on the magnetic wire 20, and the detection unit 123 detects magnetization state.

The detection unit 123, for example, includes a tunnelling insulating layer 121 provided on the magnetic wire 20 and a ferromagnetic layer 122 whose magnetization direction is in downward direction in this paper. The ferromagnetic layer 122 is provided on the tunnelling insulating layer 121. Magnetization state is detected by applying current from the ferromagnetic layer 122 to the magnetic wire 20. In this case The value of voltage drop (Vout) modulated with tunnelling magnetoresistance at the junction indicates the data stored in the magnetic wire 20.

Figure 8A:
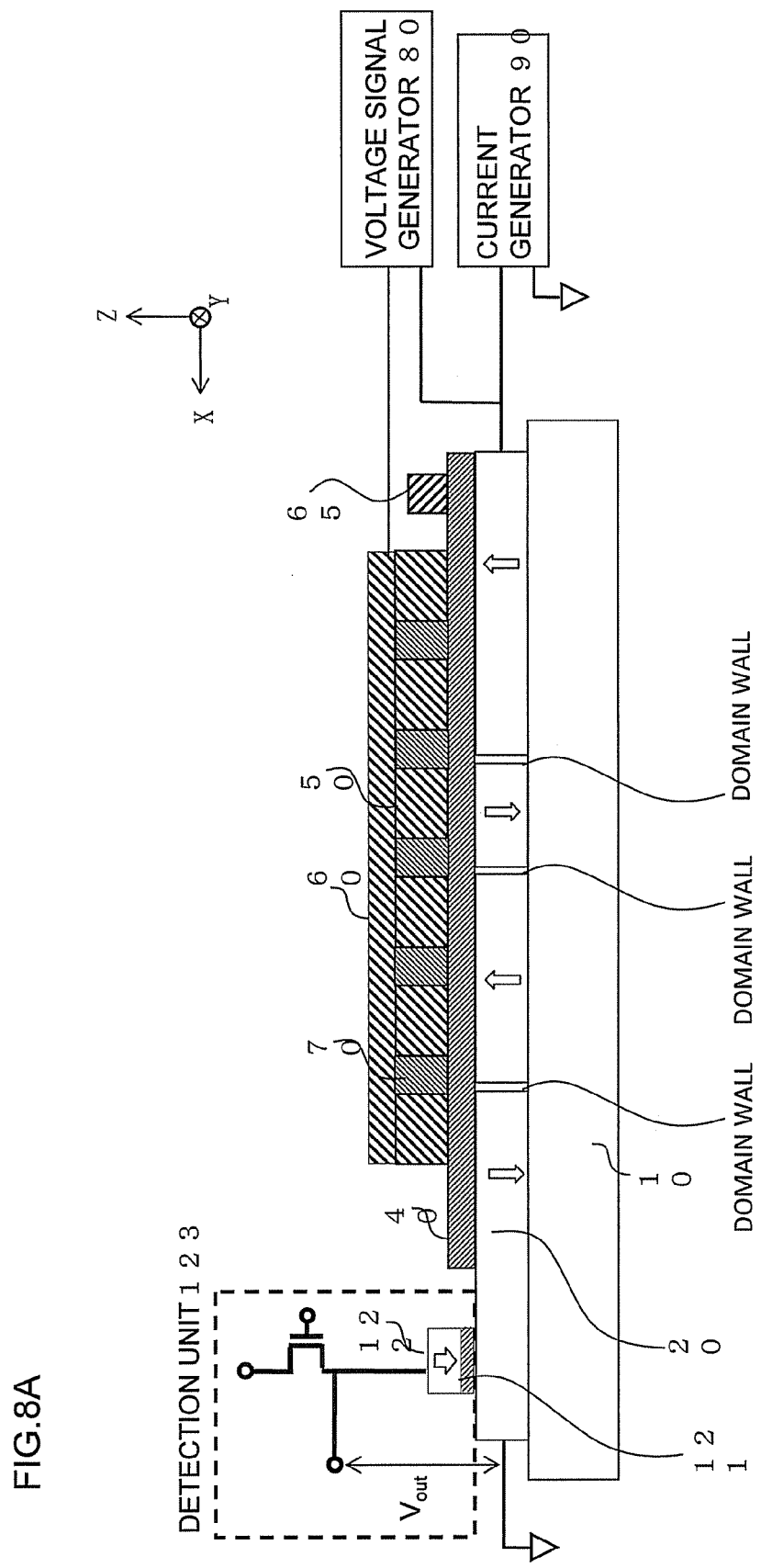
FIG. 8A is a view explaining an embodiment of a magnetic memory device.

The reading operation of the magnetic memory device 100 will be more specifically explained from FIG. 8A to FIG. 8F. FIG. 8F shows a relation between output voltage read from the detection unit 123 and the number of reading operation (cycle). From $1^{st}$ cycle to $6^{th}$ cycle corresponds to each explanation of FIG. 8A to FIG. 8E.

In an initial state, information of '011011' is already stored in the magnetic memory device 100 (FIG. 8A). Voltage (+Vadd) is applied so that potential of the second electrode 50 is higher than potential of the magnetic wire 20. Then, the current Ic is applied to the magnetic wire 20. At this time, the domain wall in the magnetic wire 20 is fixed. It is noted that voltage read from the detection unit 123 is Vlow indicating the data '0'. In FIG. 8A, there are three domain walls.

Potential of the second electrode 50 is sequentially switched to low (−Vadd) and then to high (+Vadd) with applying the current Ic to the magnetic wire 20. Then, in the extending direction of the magnetic wire 20, a domain wall, originally located between the $4^{th}$ and the $5^{th}$ second electrode 50, moves to left side in this paper for distance corresponding to the width of the second electrode 50. At this time, a domain wall originally located between the $5^{th}$ and the $6^{th}$ of the second electrode 50 is removed. In the left side of the magnetic domain under the $4^{th}$ and $5^{th}$ of the second electrode 50 there is no potential barrier. Thus, as the current Ic is applied in the magnetic wire 20, the magnetization in the magnetic wire 20 under the detection unit 123 changes from the downward direction in this paper to the upward direction in this paper. In this result, resistance of the magnetic tunnel junction in the detection unit 123 becomes higher than the junction resistance for the case in which magnetization directions of the ferromagnetic layer 122 and the part in the magnetic wire 20 under the detection unit 123 are anti-parallel to each other. Thus, voltage which is read from the detection unit 123 is Vhigh (Vhigh>Vlow), it is noted that the data '1' is stored in the magnetic wire 20 (FIG. 8B).

Potential of the second electrode 50 is sequentially switched to low (−Vadd) and then to high (+Vadd) with applying the current Ic to the magnetic wire 20. Then, in the extending direction of the magnetic wire 20, the domain wall in the magnetic wire 20 under the second insulating layer 70 provided between the $3^{rd}$ and $4^{th}$ of the second electrode 50 and the domain wall in the magnetic wire 20 under the second insulating layer 70 provided between the $4^{th}$ and $5^{th}$ of the second electrode 50 move to left side in this paper for a distance corresponding to the width of the second electrode 50 (FIG. 8C). At this time, voltage read from the detection unit 123 remains Vhigh.

The potential of the second electrode 50 is sequentially switched to low (−Vadd) and then to high (+Vadd) with applying the current Ic to the magnetic wire 20. Then, in the extending direction of the magnetic wire 20, the domain wall in the magnetic wire 20 under the second insulating layer 70 provided between the $4^{th}$ and $5^{th}$ of the second electrode 50 and the domain wall in the magnetic wire 20 under the second insulating layer 70 provided between the $5^{th}$ and $6^{th}$ of the second electrode 50 move to left side in this paper for a distance corresponding to the width of the second electrode 50 (FIG. 8D). And then the domain wall, in the magnetic wire 20 under the second insulating layer 70 provided between the $5^{th}$ and $6^{th}$ of the second electrode 50, moves the left side in this paper. In the left side of the magnetic domain under the $5^{th}$ of the second electrode 50, there is no potential barrier. Thus, as the current Ic is applied in the magnetic wire 20, the magnetization in the magnetic wire 20 under the detection unit 123 changes from the upward direction in this paper to downward direction in this paper. Voltage read from the detection unit 123 is Vlow, as a result the data '0' stored in the magnetic wire 20 is read out.

The potential of the second electrode 50 is sequentially switched to low (−Vadd) and then to high (+Vadd) with applying the current Ic to the magnetic wire 20. Then, in the magnetic wire 20, there is only one magnetic domain whose magnetization direction is the upward direction this paper (FIG. 8E). Voltage read from the detection unit 123 is Vhigh, as a result the data '1' stored in the magnetic wire 20 is read out.

In consequence of the repetition of the operation manipulating domain wall, the state of the magnetic wire 20 is changed as shown in FIG. 8A-8E. The sequential changes in the state of the magnetic wire 20 are converted to voltage output signal Vout via detection unit 123, as shown in FIG. 8F. one-cycle in FIG. 8F corresponds to one operation of domain wall manipulation mentioned above.

As mentioned above, the magnetic memory device 100 can read one bit by execution of an operation of applying voltage current to the device. Thus, the magnetic memory device 100 can output the data stored in the magnetic memory device 100 accurately.

Figure 9:
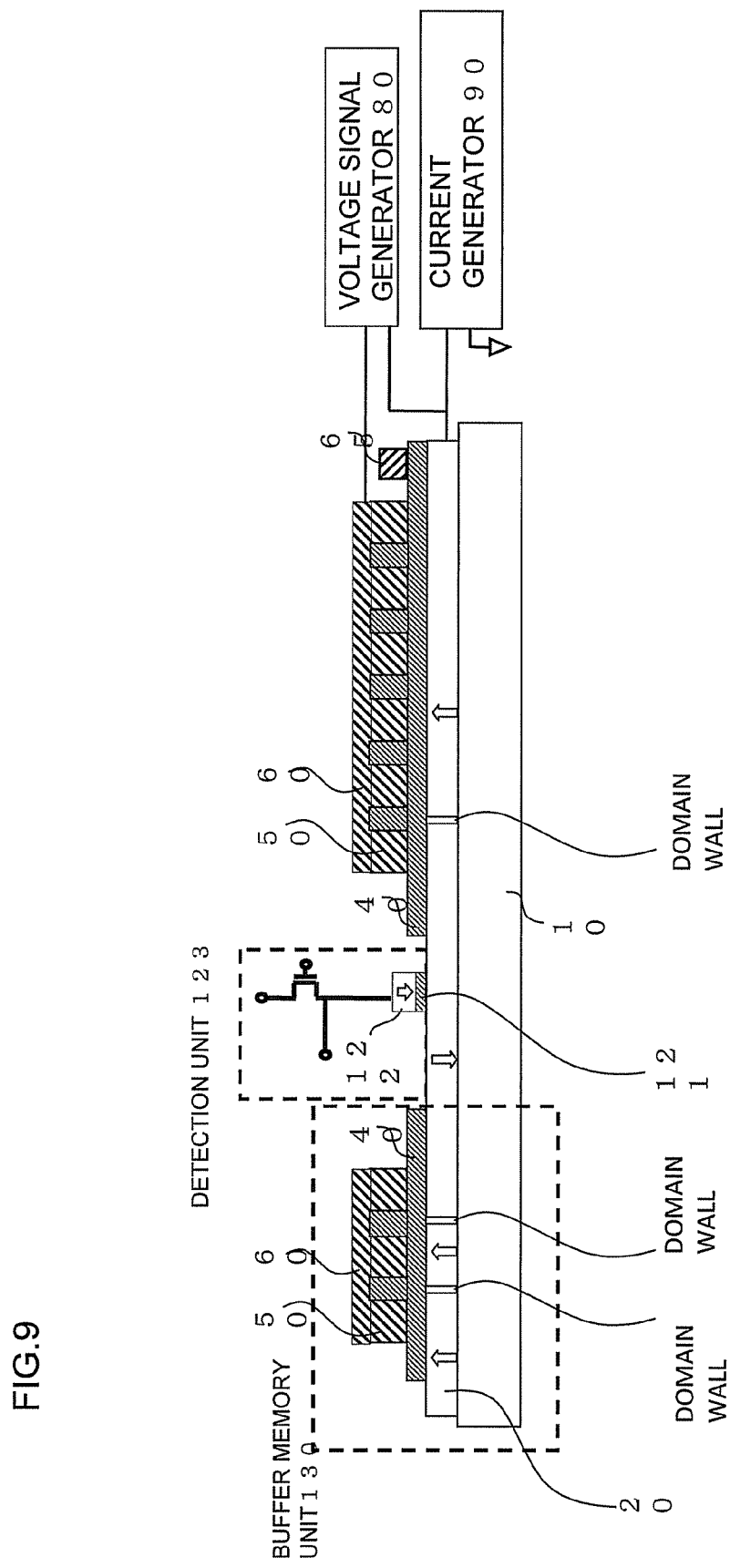
FIG. 9 is a view explaining an embodiment of a magnetic memory device.

As shown in FIG. 9, a buffer memory unit 130 can be also provided by further extending the magnetic wire 20 at the left side in this paper from the detection unit 123. At reading operation, data distruction can be avoid by providing the buffer memory unit 130.

One example of fabrication procedure of the magnetic memory device 100 will be explained by use of FIG. 10 to FIG. 15. In FIG. 10 to FIG. 15 cross sectional images of the magnetic wire 20 viewing from the extending direction of the magnetic wire 20 are shown.

Figure 10:
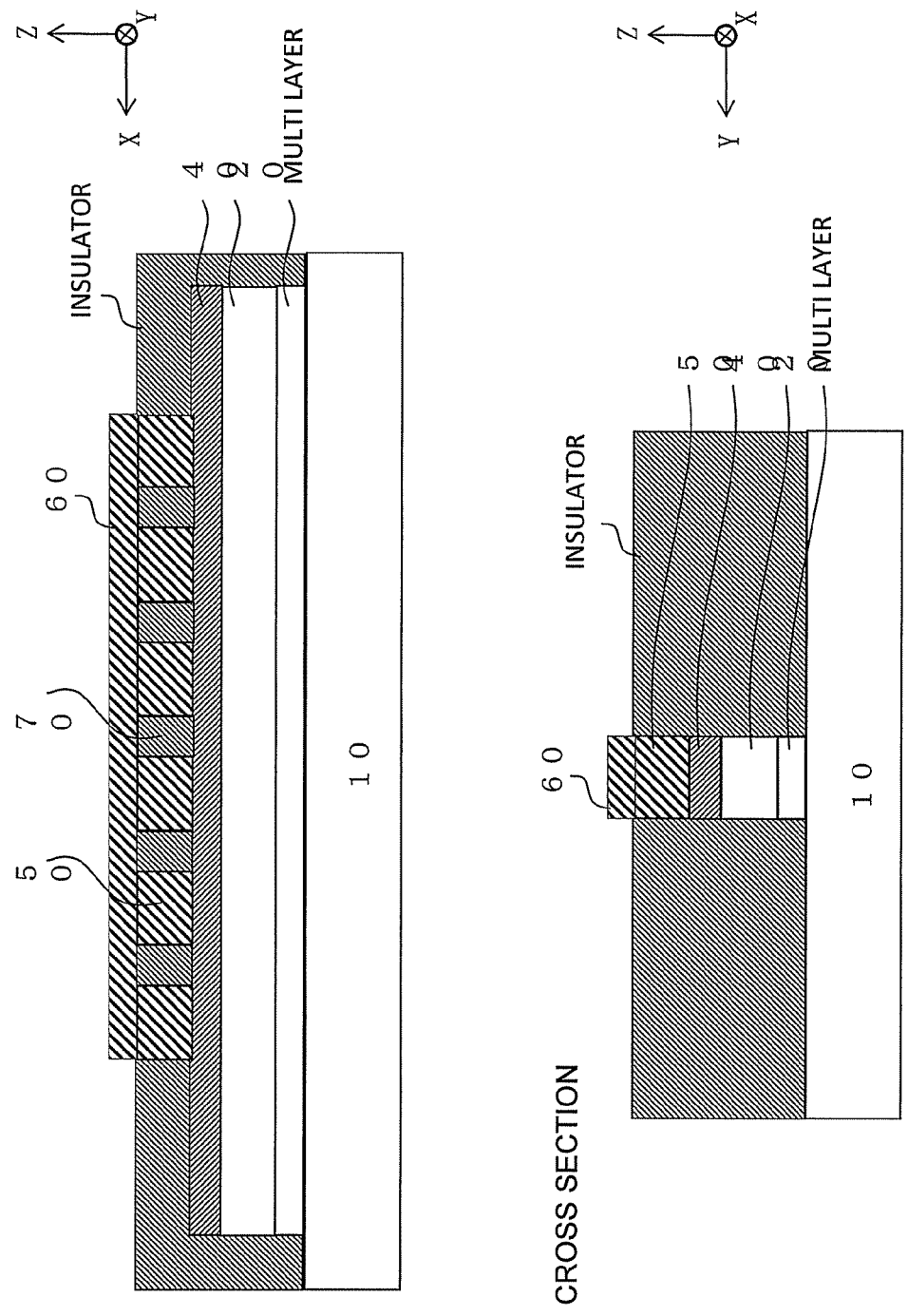
FIG. 10 is a view explaining an embodiment of a magnetic memory device.

As shown in FIG. 10, the magnetic memory device 100 is surrounded by an insulator. The third electrode 60 is uncovered with the insulator. As necessary, the voltage signal generator 80 and the detection unit 123 or like can be connected to the magnetic memory device 100 by additional processes to the magnetic memory device 100.

Figure 11:
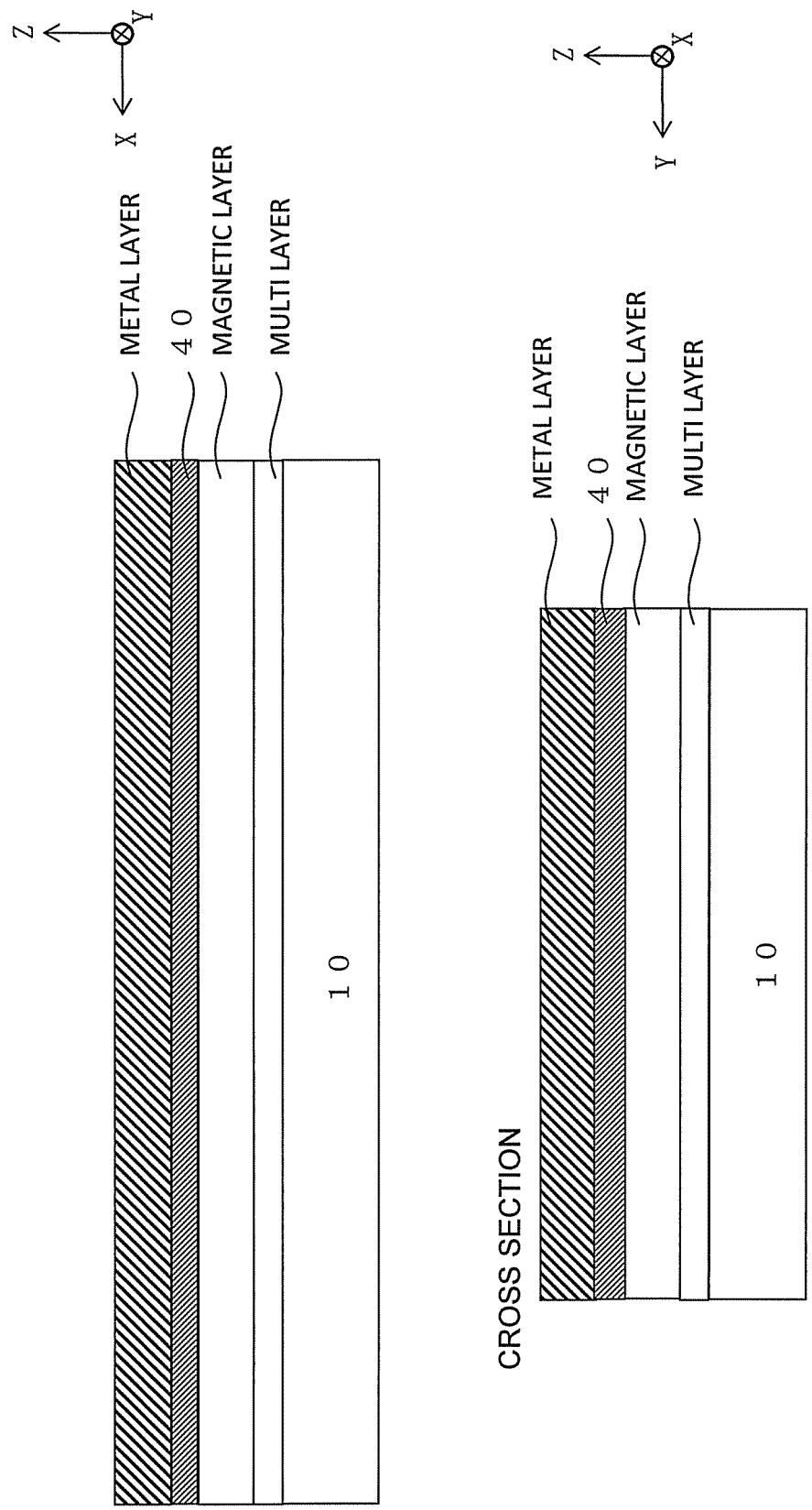
FIG. 11 is a view explaining an embodiment of a magnetic memory device.

Multilayers of Ta, Ru, and Ta in this order are deposited on thermal silicon oxide layer (substrate 10) which is formed on a silicon substrate by use of an ultrahigh-vacuum sputtering system. Then, a magnetic layer corresponding to the magnetic wire 20, the first insulating layer 40, and a metal layer corresponding to the second electrode 50 are deposited on the multilayer in this order (FIG. 11). Cu can be used for the metal layer. The multilayer is used so that magnetic and electronic properties of the magnetic layer are not affected by the surface state of the substrate 10 and uncertainties generating during depositional process.

Figure 12:
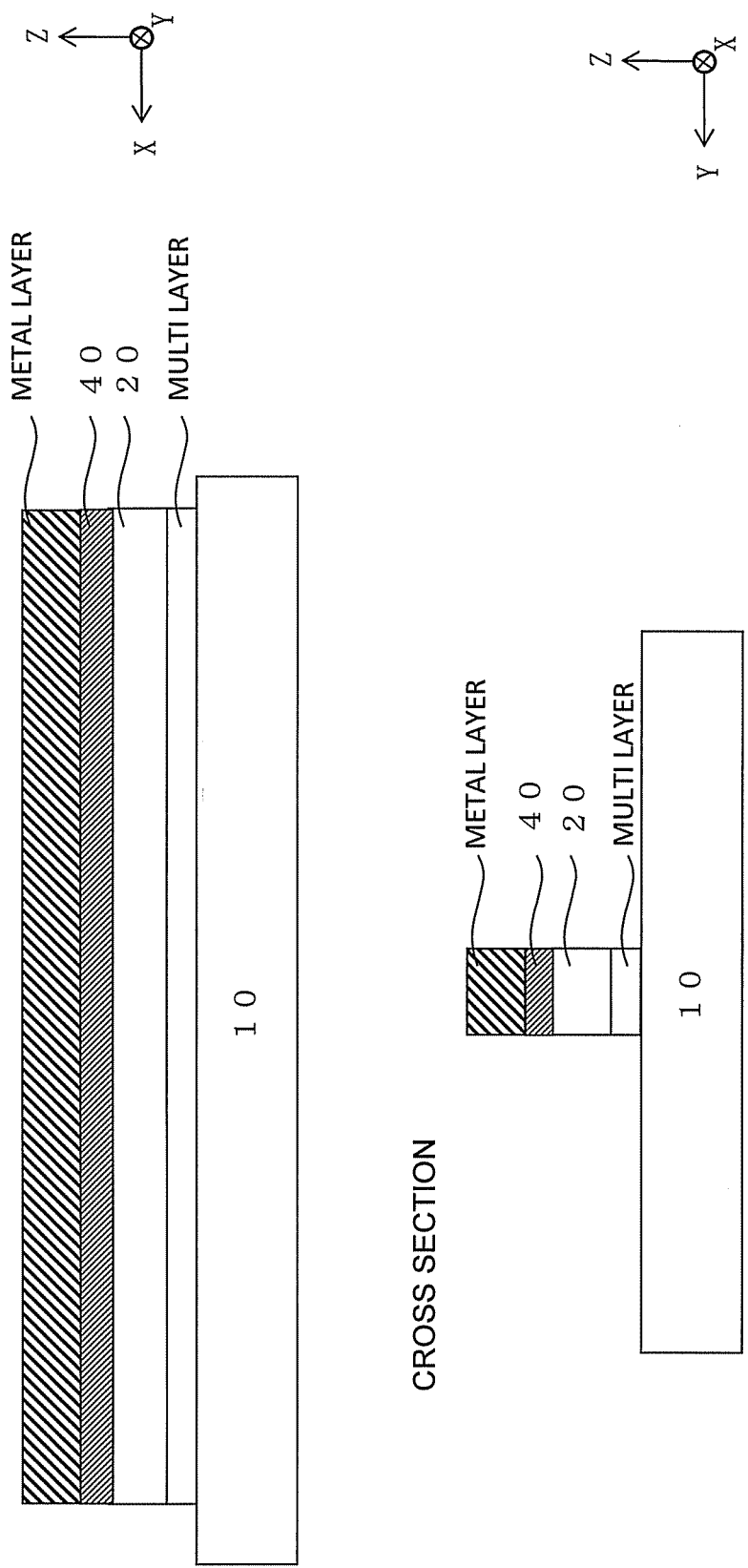
FIG. 12 is a view explaining an embodiment of a magnetic memory device.

Negative resist is applied on the metal layer. Mask pattern is formed by exposing and developing a part of the negative resist with an electron beam drawing equipment. Milling process is performed to remove all layers in the area not covered with the resist mask pattern using an ion milling system. The mask patter is removed by remover (FIG. 12). Then, as shown a lower figure in FIG. 12, the magnetic wire 20 is formed.

Figure 13:
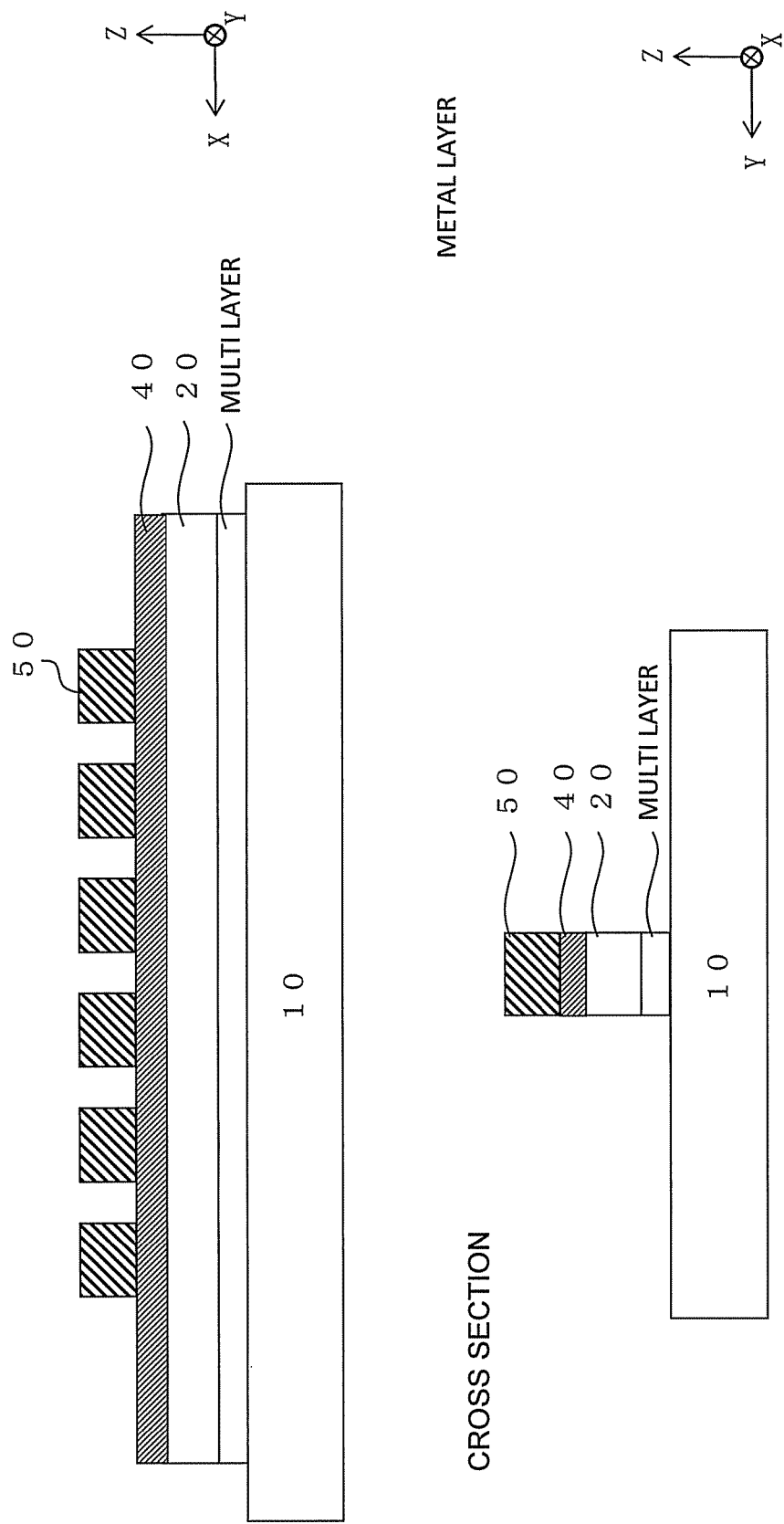
FIG. 13 is a view explaining an embodiment of a magnetic memory device.

A positive resist is applied on the metal layer. A mask pattern, which covers the area corresponding to the second electrode 50 is formed by using photolithography techniques. The metal layer is milled by use of the mask pattern. At this time, depth of milling is controlled mass analyzer attached to the ion milling system. The mask pattern is removed with stripper/remover (FIG. 13). Then, as shown in FIG. 13, the second electrode formed on the first insulating layer 40.

Figure 14:
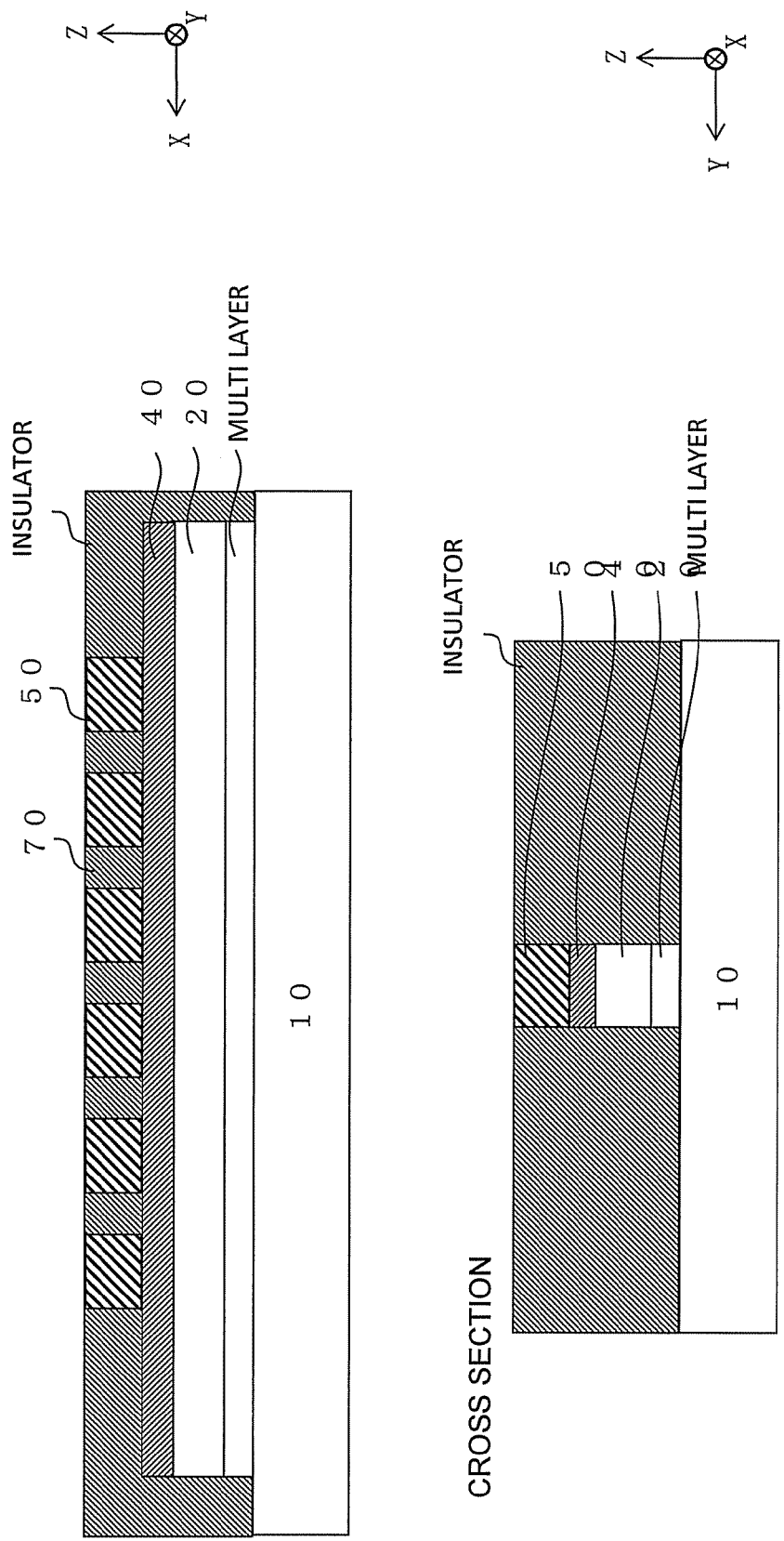
FIG. 14 is a view explaining an embodiment of a magnetic memory device.

A silicon oxide corresponding to the insulator is deposited on the substrate 10, the second electrode 50, and the first insulating layer 40 in the ultrahigh-vacuum sputtering system. Residue of the silicon oxide is polished by chemical mechanical polishing (CMP). The polishing is performed until silicon oxide on surface of the second electrode 50 is completely removed (FIG. 14).

Figure 15:
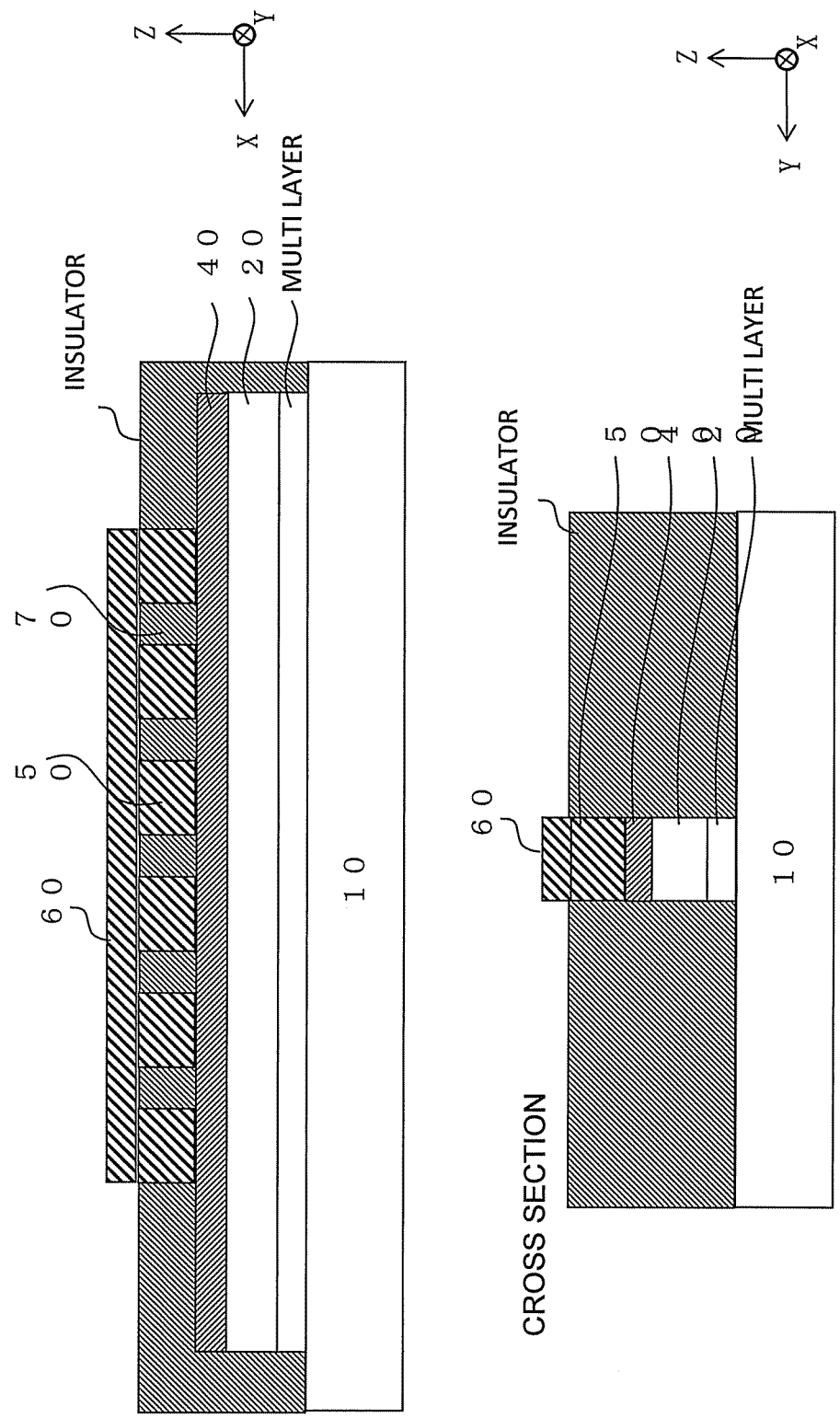
FIG. 15 is a view explaining an embodiment of a magnetic memory device.

Cu corresponding to the third electrode 60 is deposited on the second electrode 50 and the insulator in the ultrahigh-vacuum sputtering system. Then Mask pattern is formed by electron beam lithograph technique. The Cu is milled by use of the mask pattern with an ion milling system. The mask pattern is removed with stripper/remover (FIG. 15). Then, the magnetic memory device 100 is fabricated.

Figure 16:
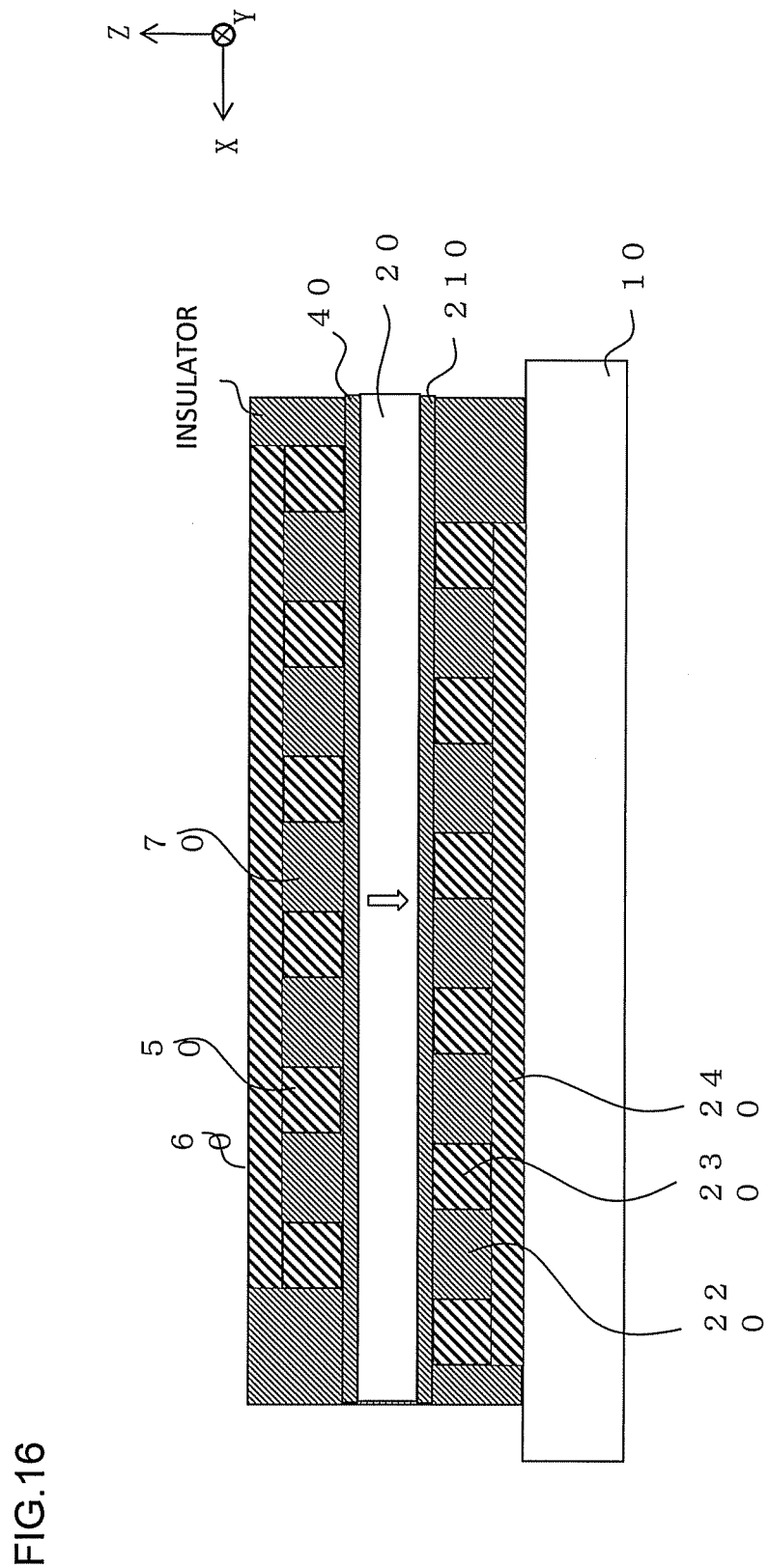
FIG. 16 is a view explaining a modified example of an embodiment of a magnetic memory device.

FIG. 16 shows a modified example of the magnetic memory device 100. A magnetic memory device 200 further comprises a forth insulating layer 210, a third insulating layer 220, a fourth insulating layer 230, and a fifth electrode 240 between the magnetic wire 20 and the substrate 10.

The fourth insulating layer 210 is provided on a side opposite to a side where the first insulating layer 40 is provided in the magnetic wire 20. Same materials as the first insulating layer 40 can be used for the fourth insulating layer 210.

The third insulating layer 220 is provided on a side opposite to a side where the fourth insulating layer 210 is provided in the magnetic wire 20, and the third insulating layer 220 faces the second electrode 50. Materials used for the second insulating layer 70 can be used for the third insulating layer 220.

The fourth electrode 230 is provided on a side opposite to a side where the fourth insulating layer 210 is provided in the magnetic wire 20, and position in x-axis of the fourth electrode 230 is same one of the second insulating layer 70. The fifth electrode 240 is electrically connected to the fourth electrode 230 in direction that the magnetic wire 20 extends. Materials used for the first electrode 30, the second electrode 50, and the third electrode 60 can be used for the fourth electrode 230 and the fifth electrode 240. The fourth electrode 230 and the fifth electrode 240 can be integrally formed.

The operation of the magnetic memory device 200 is different from that of the magnetic memory device 100. In the operation of the magnetic memory device 200, voltage is applied to the magnetic wire 20 so that potential of the second electrode 50 and the fourth electrode 230 becomes different. Thus, the potential of the fourth electrode 230 is positive if the potential of the second electrode 50 is negative. In performing this, the domain wall in the magnetic wire 20 can be controlled more accurately because large potential barrier can be formed in the magnetic wire 20.

Figure 17:
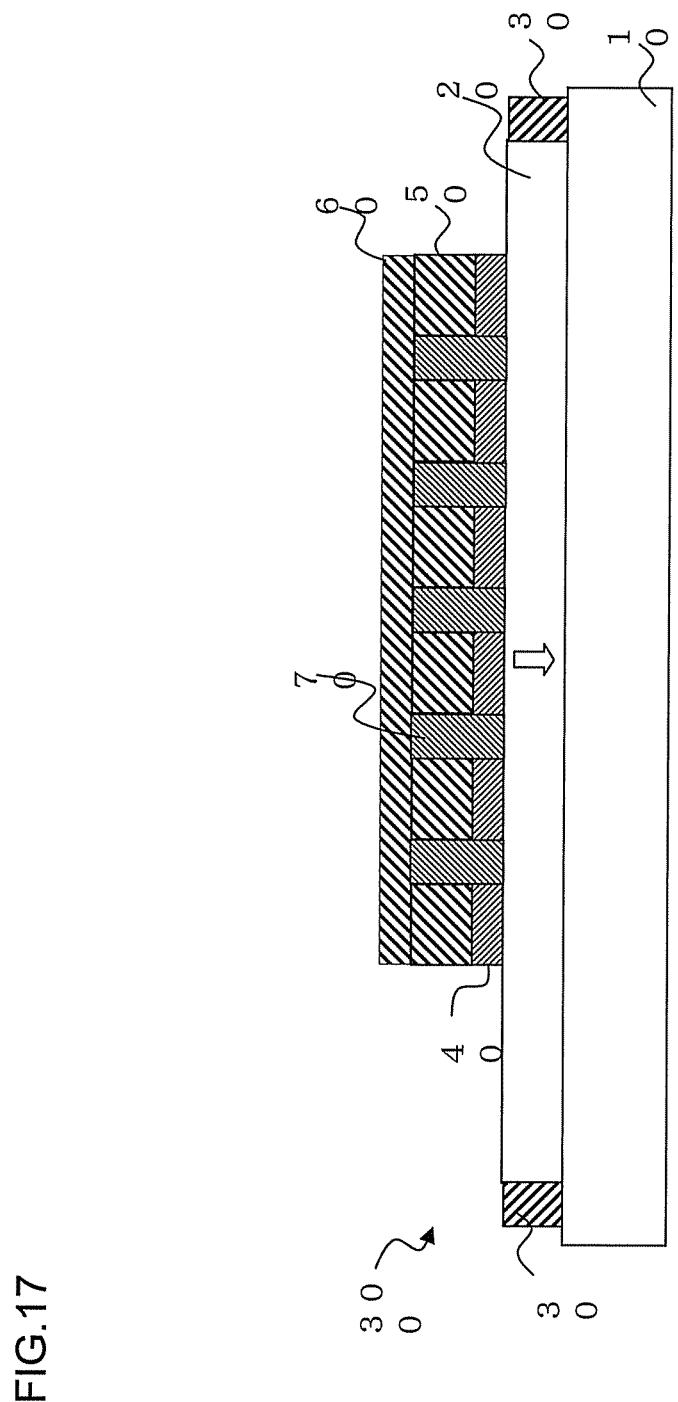
FIG. 17 is a view explaining a modified example of an embodiment of a magnetic memory device.

FIG. 17 shows a modified example of the magnetic memory device 100. A magnetic memory device 300 is different from the magnetic memory device 100 in that the first insulating layer 40 is provided only between the second electrode 50 and the magnetic wire 20.

Thus, in the magnetic memory device 300, the second insulating layer 70 is directly connected to the magnetic wire 20. For example, MgO (magnesium oxide) is used for the first insulating layer 40, SiOx (silicon oxide, 0<x≤2) is used for the second insulating layer 70. These materials can apply different strength of interface-induced anisotropy to the magnetic wire 20. Thus, spatial distribution of magnetic potential energy exists the magnetic wire 20 even if the state of the magnetic wire 20 is equilibrium state in which voltage is not applied. For this reason, movement of the domain wall caused by disturbance such as thermal or external field can be protected by use of these structures.

The extending direction of the magnetic wire 20 in the magnetic memory device 100, 200, 300 can be in the upward direction in this paper (laminating in longitudinal direction)

While certain embodiments of the embodiment of the invention have been described, these embodiments have been presented by way of example only, and are not intended to limit the scope of the embodiment of the inventions. Indeed, the novel elements and apparatuses described herein may be embodied in a variety of other forms; furthermore, various omissions, substitutions and changes in the form of the methods and systems described herein may be made without departing from the spirit of the embodiment of the invention. The accompanying claims and their equivalents are intended to cover such forms or modifications as would fall within the scope and spirit of the embodiment of the invention.

What is claimed is:

1. A magnetic memory device comprising:
   a magnetic wire comprising a plurality of magnetic domains separated by a domain wall, the magnetic wire extending in a first direction;
   a pair of first electrodes operable to pass a current through the magnetic wire in the first direction or in an opposite direction to the first direction;
   a first insulating layer provided on the magnetic wire in a second direction, the second direction being substantially perpendicular to the first direction;
   a plurality of second electrodes provided on the first insulating layer and provided at a specified interval in the second direction; and
   a third electrode electrically connected to the plurality of second electrodes.

2. The device of claim 1, further comprising a plurality of second insulating layers electrically insulating the plurality of second electrodes in the first direction.

3. The device of claim 2, a dielectric constant of the first insulating layer is larger than a dielectric constant of the plurality of second insulating layers.

4. The device of claim 3, the plurality of second electrodes and the third electrode are integrally formed.

5. The device of claim 4, a thickness of the plurality of second electrodes in the first direction is larger than a thickness of the domain wall in the first direction.

6. The device of claim 2, further comprising:
   a third insulating layer provided on a side opposite to a side where the first insulating layer is provided in the magnetic wire;
   a plurality of fourth electrodes provided on a side opposite to a side where the magnetic wire is provided in the third insulating layer, the plurality of fourth electrodes facing the second insulating layer; and
   a fifth electrode electrically connected to the plurality of the fourth electrodes.

7. The device of claim 6, further comprising a plurality of fourth insulating layers electrically insulating the plurality of fourth electrodes.

8. The device of claim 7, a dielectric constant of the third insulating layer is larger than a dielectric constant of the plurality of fourth insulating layers.

9. The device of claim 8, the plurality of fourth electrodes and the fifth electrode are integrally formed.

10. The device of claim 9, a thickness of the plurality of fourth electrodes in the first direction is larger than the thickness of the magnetic wire in the first direction.

11. A method of recording information, comprising:
    applying voltage using a set of first electrodes to a magnetic wire so that a potential of a set of second electrodes is higher than a potential of the magnetic wire, the magnetic wire comprising a plurality of magnetic domains separated by a domain wall, the magnetic wire extending in a first direction; and
    applying a current to the magnetic wire to switch the potential of a second electrode.

* * * * *